United States Patent
Nomura

(10) Patent No.: US 10,229,878 B2
(45) Date of Patent: Mar. 12, 2019

(54) SEMICONDUCTOR DEVICE

(71) Applicant: Renesas Electronics Corporation, Tokyo (JP)

(72) Inventor: Yoshihiro Nomura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 64 days.

(21) Appl. No.: 15/324,646

(22) PCT Filed: Aug. 8, 2014

(86) PCT No.: PCT/JP2014/071074
§ 371 (c)(1),
(2) Date: Jan. 6, 2017

(87) PCT Pub. No.: WO2016/021061
PCT Pub. Date: Feb. 11, 2016

(65) Prior Publication Data
US 2018/0182706 A1    Jun. 28, 2018

(51) Int. Cl.
*H01L 23/52* (2006.01)
*H01L 23/525* (2006.01)
(Continued)

(52) U.S. Cl.
CPC .......... *H01L 23/5256* (2013.01); *H01L 21/82* (2013.01); *H01L 21/8234* (2013.01); *H01L 27/06* (2013.01)

(58) Field of Classification Search
CPC .................. H01L 23/5256; H01L 23/5258
See application file for complete search history.

(56) References Cited

U.S. PATENT DOCUMENTS

| 6,656,826 B2 | 12/2003 | Ishimaru |
| 2008/0093703 A1* | 4/2008 | Yang .................... H01L 23/5256 |
| | | 257/529 |

(Continued)

FOREIGN PATENT DOCUMENTS

| JP | S 62-238658 A | 10/1987 |
| JP | H 05-243387 A | 9/1993 |

(Continued)

OTHER PUBLICATIONS

International Search Report (ISR) (PCT Form PCT/ISA/210), in PCT/JP2014/071074, dated Nov. 4, 2014.

(Continued)

*Primary Examiner* — Joseph Galvin, III
(74) *Attorney, Agent, or Firm* — McGinn I.P. Law Group, PLLC.

(57) ABSTRACT

A semiconductor device includes an insulating film formed to cover an electric fuse (EF1), an insulating film (IL1), an insulating film (IL2), an electric fuse (EF1), an insulating film (IL1), and an insulating film (IL2). The electric fuse (EF1) includes a fuse-blowing portion (FC1), a first pad portion (PD1), and a second pad portion (PD2). The fuse-blowing portion (FC1) is formed between the first pad portion (PD1) and the second pad portion (PD2) in a first direction and is a rectangular shape having a first short side and a second short side along a second direction perpendicular to the first direction. The insulating film (IL1) is formed continuously between the first short side and the second short side to cover the surface of the fuse-blowing portion (FC1). The insulating film (IL2) is formed to planarly surround the insulating film (IL1) and is arranged at an interval from the insulating film (IL1). The stress of the insulating film (IL1) and the insulating film (IL2) is greater (Continued)

than a stress of the insulating film covering the insulating films.

17 Claims, 21 Drawing Sheets

(51) Int. Cl.
*H01L 21/82* (2006.01)
*H01L 21/8234* (2006.01)
*H01L 27/06* (2006.01)

(56) References Cited

U.S. PATENT DOCUMENTS

| | | | |
|---|---|---|---|
| 2012/0161278 A1 | 6/2012 | Meyer et al. | |
| 2013/0189882 A1* | 7/2013 | Arimura | H01H 85/055 |
| | | | 439/890 |
| 2015/0179753 A1* | 6/2015 | Boschke | H01L 29/4975 |
| | | | 257/529 |

FOREIGN PATENT DOCUMENTS

| | | |
|---|---|---|
| JP | H11-163154 A | 6/1999 |
| JP | 2010-507256 A | 3/2010 |
| JP | 2013-045802 A | 3/2013 |
| JP | 2013-149856 A | 8/2013 |

OTHER PUBLICATIONS

Japanese Office Action dated Oct. 24, 2017 in Japanese Application No. 2016-539788 with an English translation thereof.
Taiwanese Office Action dated Jan. 15, 2019, in corresponding Patent Application No. 10820043320.

* cited by examiner

FIG. 10
(a)
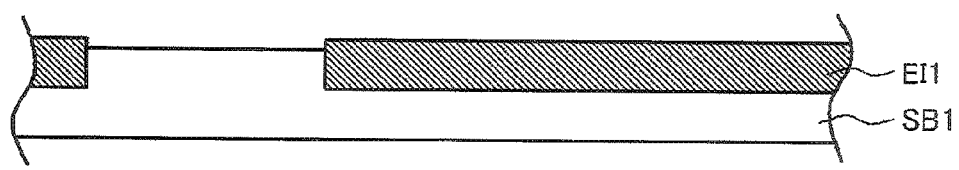
(b)
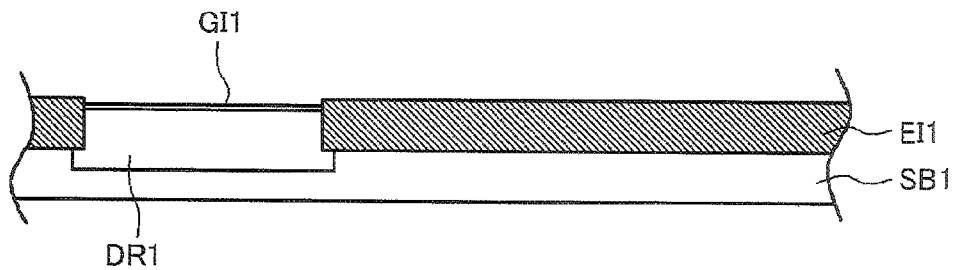

FIG. 11
(a)
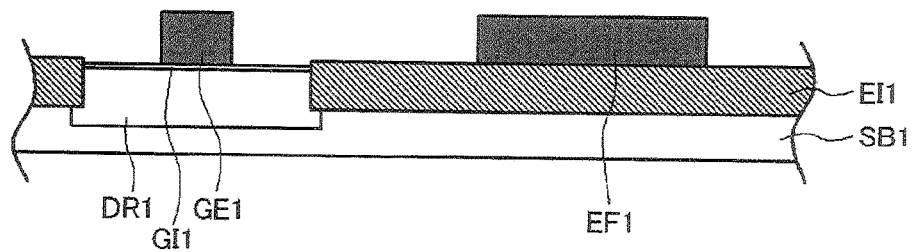
(b)
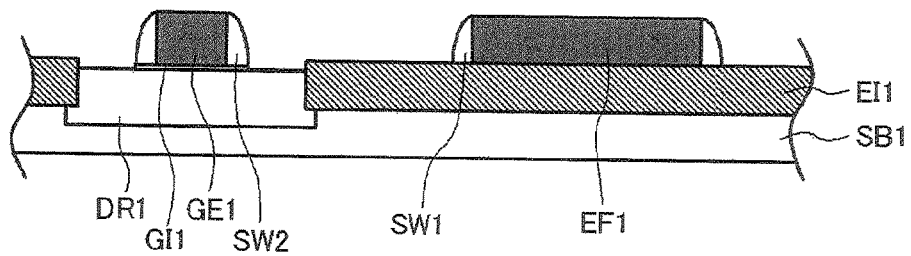

FIG. 12
(a)
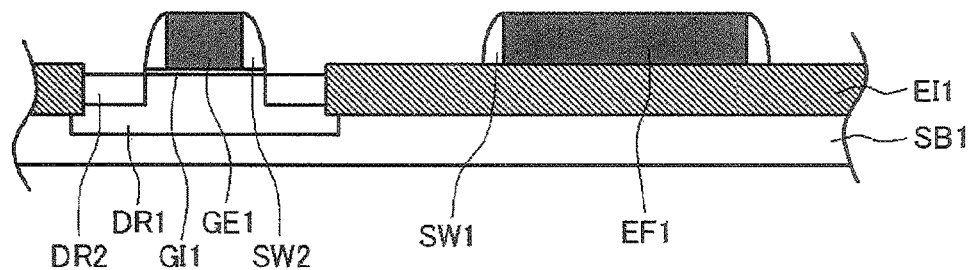
(b)
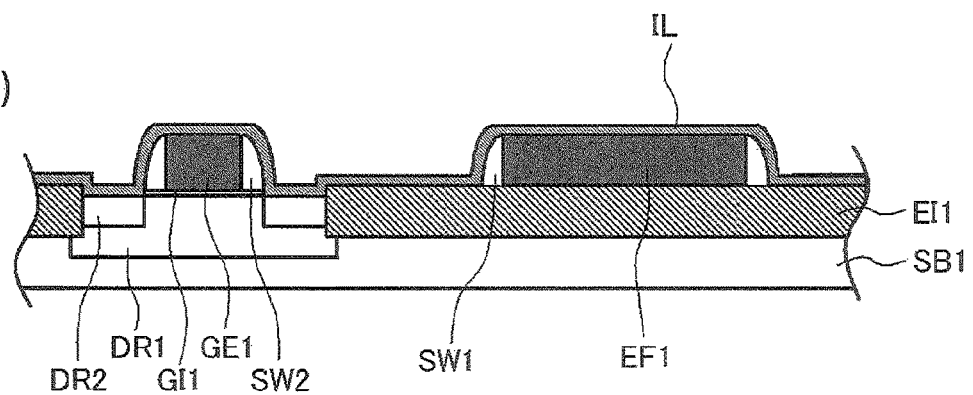

FIG. 13
(a)
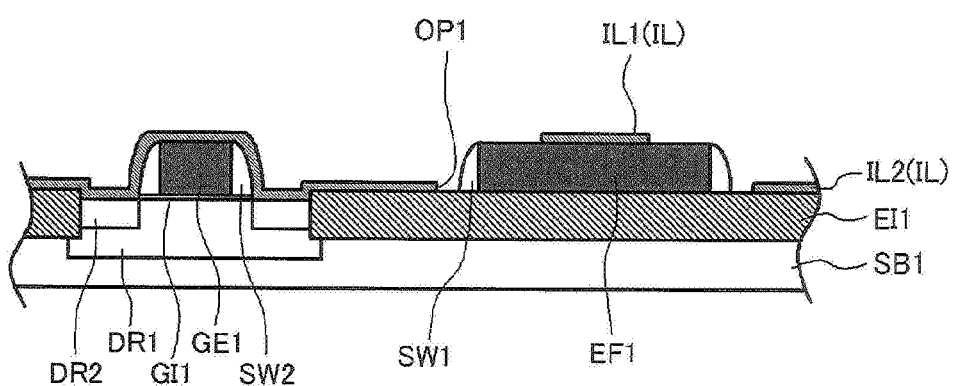
(b)
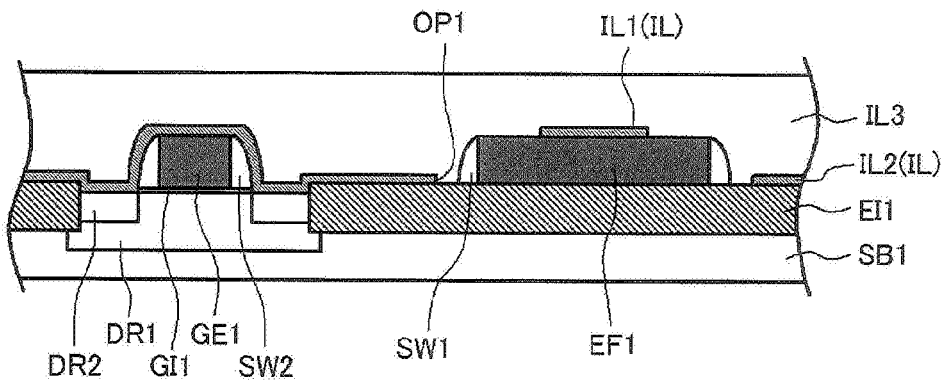

FIG. 16
(a)
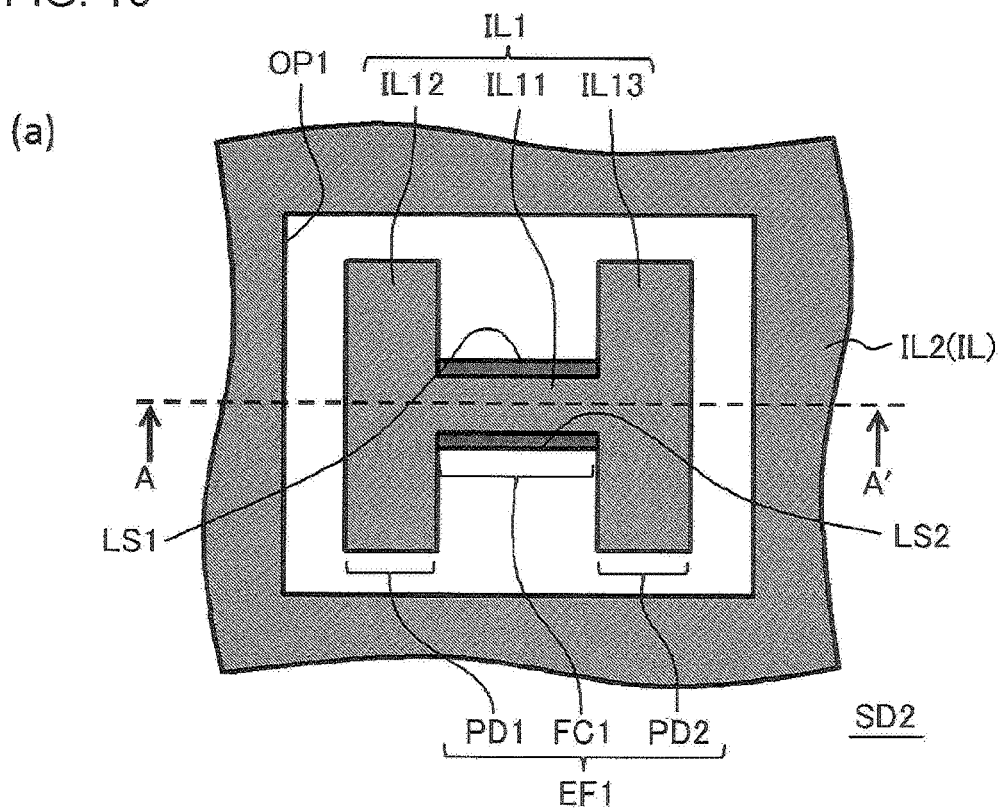
(b) A-A'
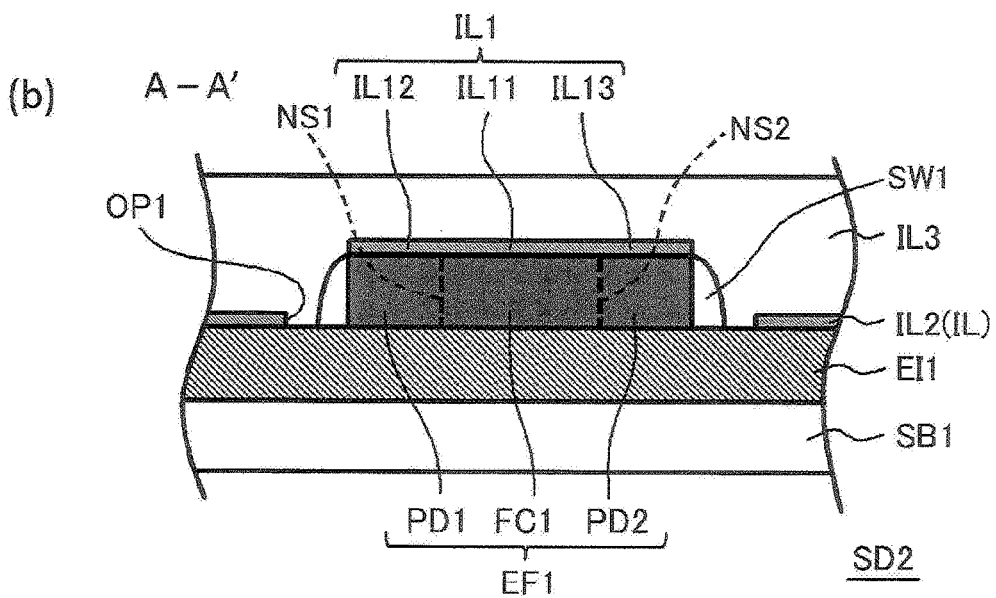

FIG. 20
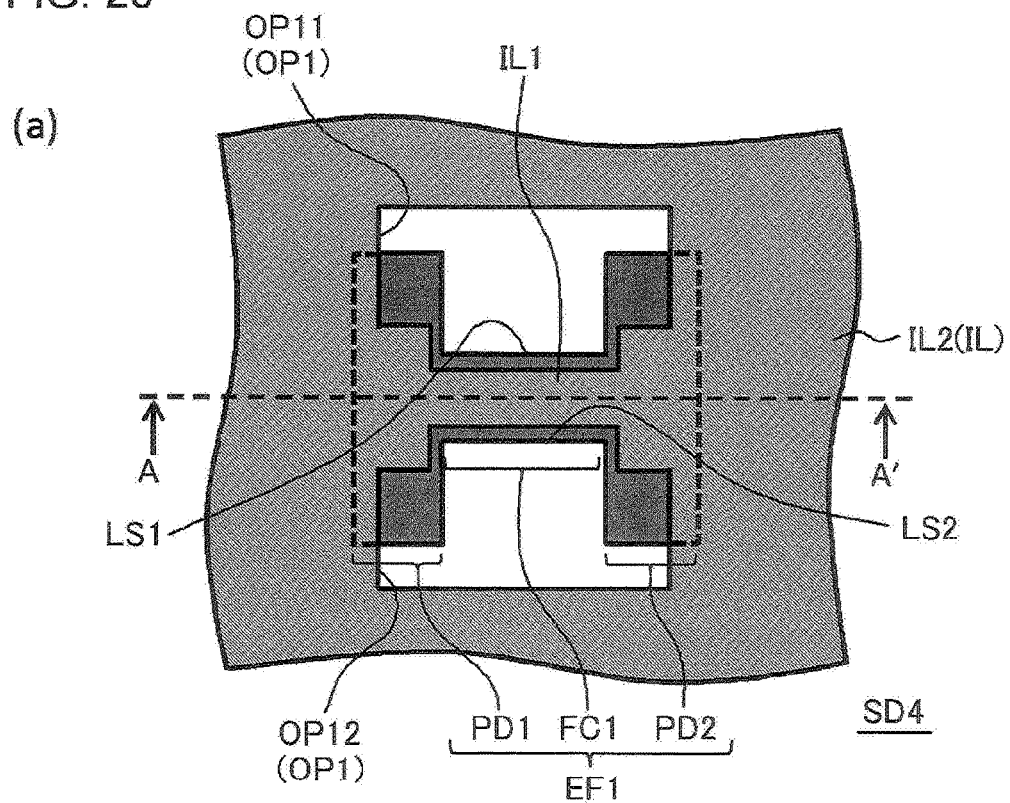
(a)
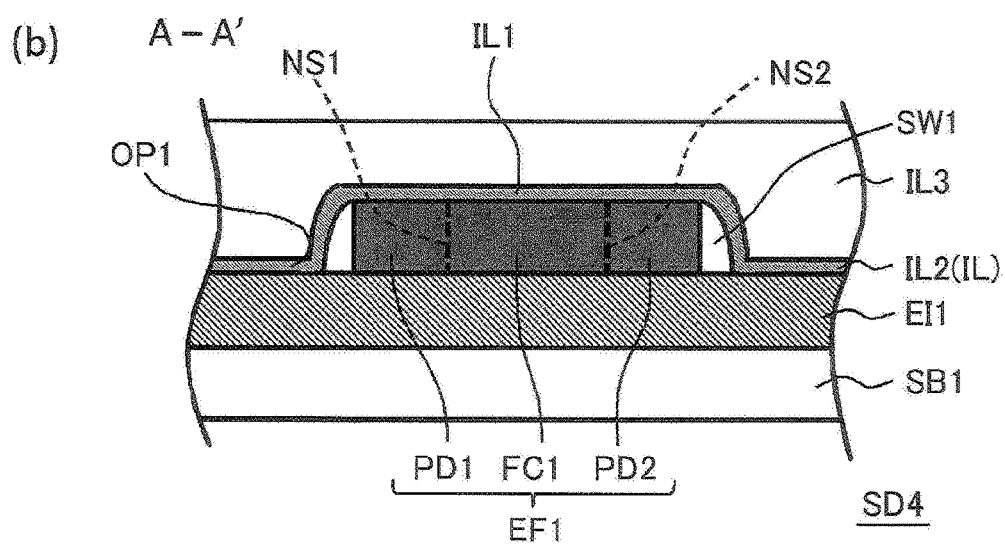
(b)

SEMICONDUCTOR DEVICE

TECHNICAL FIELD

The present invention relates to a semiconductor device, for instance, a technique applicable to a semiconductor device including a fuse.

BACKGROUND ART

Several studies have been made on a technique relating to a semiconductor device including a fuse, as exemplified in a technique described in Patent Document 1.

Patent Document 1 is a technique relating to an electric fuse. Specifically, it describes an electric fuse which includes a conductor including an interconnect portion and first and second terminal portions, and a protection film including an opening above a region sandwiched between the first terminal portion and the second terminal portion and having a tensile stress formed above at least a part of the interconnect portion.

RELATED DOCUMENT

Patent Document

[Patent Document 1] Japanese Unexamined Patent Publication No. 2013-149856

SUMMARY OF THE INVENTION

There may be a case where an insulating film made of insulating material with a high magnitude of a film stress is formed on a semiconductor substrate to cover a fuse-blowing portion of an electric fuse where a blown portion is to be generated. In such a case, there is concern that the insulating film may break according to expansion of the fuse-blowing portion when the electric fuse is blown and damage may occur on the another interlayer located on the insulating film due to the breakage. The technique described in Patent Document 1 has a difficulty to minimize the damage to the interlayer.

Other problems to be solved and new features will become apparent from the descriptions of the present specification and the accompanying drawings.

According to one embodiment, an insulating film with a high magnitude of a film stress is formed over the entirety of the fuse-blowing portion, and the insulating film is not formed on a side surface of the fuse-blowing portion, to facilitate variation in the position of the insulating film in an up and down direction on the fuse-blowing portion.

The one embodiment enables improvement of reliability of a semiconductor device having an electric fuse.

BRIEF DESCRIPTION OF THE DRAWINGS

The object described above, other objects, features and advantages become further apparent from preferred embodiments which will be described later and the drawings according to the embodiments.

FIG. 10 is a sectional view illustrating a manufacturing method of the semiconductor device shown in FIG. 4.

FIG. 11 is another sectional view illustrating the manufacturing method of the semiconductor device shown in FIG. 4.

FIG. 12 is still another sectional view illustrating the manufacturing method of the semiconductor device shown in FIG. 4.

FIG. 13 is still yet another sectional view illustrating the manufacturing method of the semiconductor device shown in FIG. 4.

FIG. 16 is a diagram illustrating the first modification example of the semiconductor device shown in FIG. 15.

FIG. 20 is a diagram illustrating a semiconductor device according to a fourth embodiment.

DESCRIPTION OF EMBODIMENTS

Figure 1:
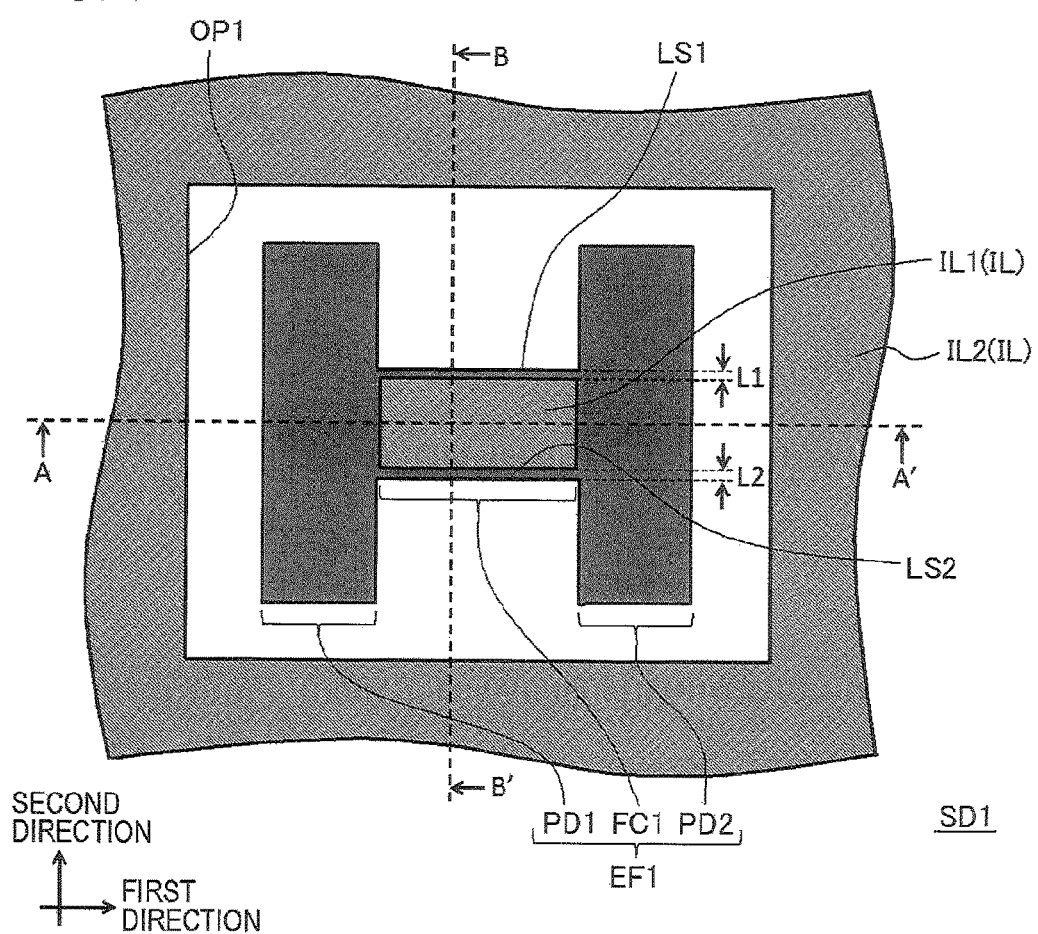
FIG. 1 is a plan view illustrating a semiconductor device according to a first embodiment.

In the following, description will be made on the embodiment using the figures. In all figures, similar reference numerals are given to similar constitutional elements and descriptions thereof will not be repeated.

First Embodiment

Figure 2:
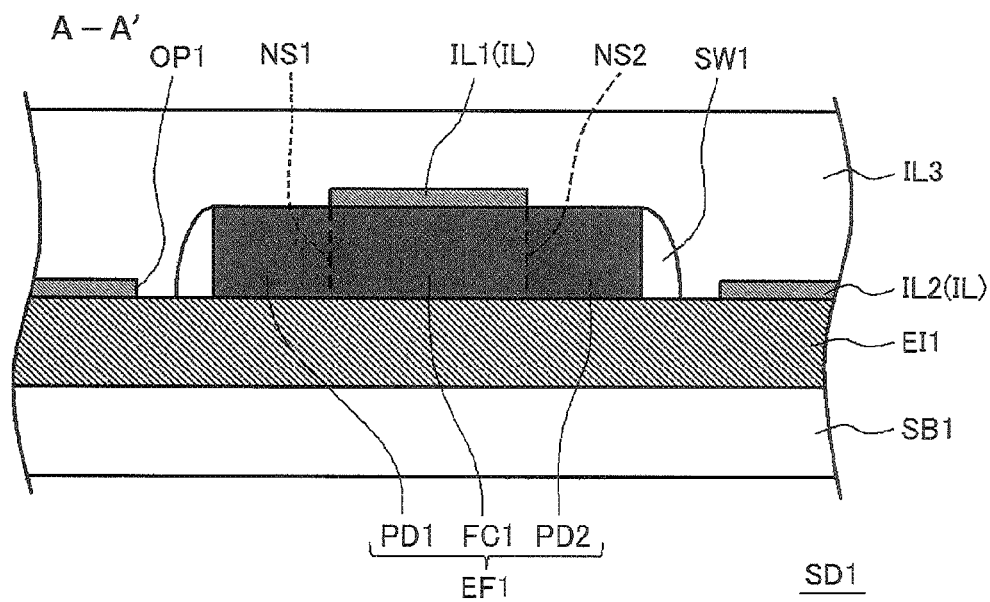
FIG. 2 is a sectional view illustrating the semiconductor device shown in FIG. 1.
Figure 3:
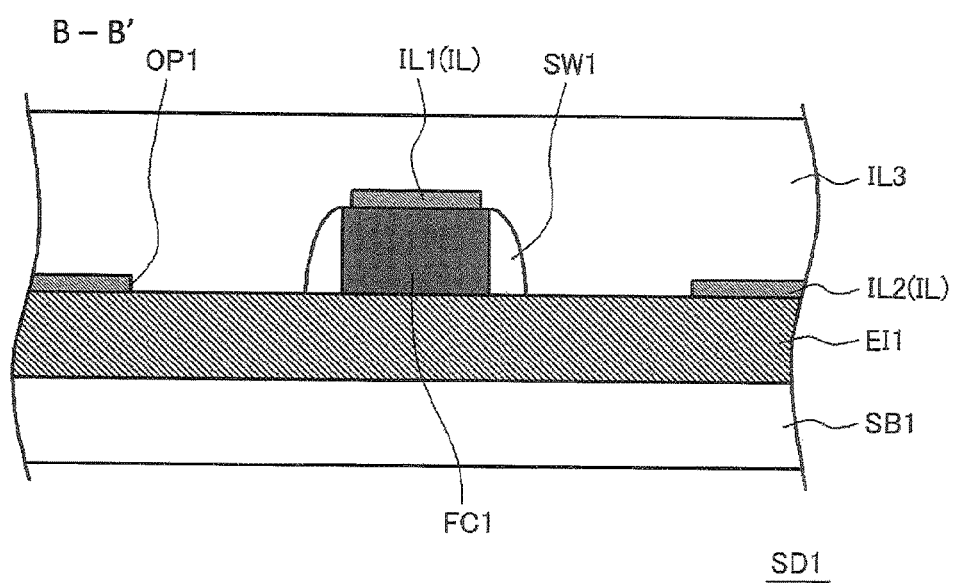
FIG. 3 is another sectional view illustrating the semiconductor device shown in FIG. 1.

FIG. 1 is a plan view illustrating a semiconductor device SD1 according to a first embodiment. FIG. 2 and FIG. 3 are sectional views illustrating the semiconductor device SD1 shown in FIG. 1. FIG. 2 and FIG. 3 illustrate a section taken along the line A-A' in FIG. 1 and a section taken along the line B-B' in FIG. 1, respectively.

The electric fuse is configured by, for instance, two pad portions and a fuse-blowing portion having a narrow width and located between the pad portions. A described above, in a case where an insulating film is made of the insulating material with a high magnitude of a film stress to cover the fuse-blowing portion on the semiconductor substrate, there is concern that the insulating film is broken according to expansion of the fuse-blowing portion when the electric fuse is blown. Such concern becomes especially remarkable as a voltage when blowing is induced becomes large. On the other hand, in a case where the fuse-blowing portion is not covered by the insulating film, there is risk that damage to another interlayer located on the fuse-blowing portion occurs due to upward extension of a void generated in the fuse-blowing portion when the electric fuse is blown.

For that reason, investigations was performed on forming of the insulating film with a high magnitude of a film stress over the entirety of the fuse-blowing portion and suppressing breakage of the insulating film when the electric fuse is blown. As a result of keen examination by the present inventors, the following two points were inferred as factors capable of causing the breakage of the insulating film when the electric fuse is blown.

(a) A portion of the insulating film located on a side surface of the fuse-blowing portion has low adhesion; and (b) A position of the portion of the insulating film located on the fuse-blowing portion in an up and down direction is fixed, to cause insufficient relaxing of pressure caused by expansion of the fuse-blowing portion.

The semiconductor device SD1 according to the present embodiment is realized based on such investigations. According to the present embodiment, an insulating film with a high magnitude of a film stress is formed over the entirety of the fuse-blowing portion, and the insulating film is not formed on a side surface of the fuse-blowing portion, to facilitate variation in the position of the insulating film in an up and down direction on the fuse-blowing portion. Not forming the insulating film on the side surface of the fuse-blowing portion enables prevention of the breakage caused by the (a). Facilitating variation in the position of the portion of the insulating film located on the fuse-blowing portion in an up and down direction allows sufficient relaxing of the pressure caused by expansion of the fuse-blowing portion, to thereby enable prevention of the breakage caused by the (b). As such, the present embodiment enables prevention of occurrence of the breakage on the insulating film when the electric fuse is blown, and improvement of reliability of the semiconductor device including the electric fuse.

An example of the semiconductor device SD1 according to the present embodiment may include one including a semiconductor substrate SB1, an electric fuse EF1, an insulating film IL1, an insulating film IL2, and insulating film IL3. The electric fuse EF1 is formed on the semiconductor substrate SB1 and is blown by allowing a predetermined current to flow. The electric fuse EF1 includes a polysilicon film. Furthermore, the electric fuse EF1 includes a fuse-blowing portion FC1, a first pad portion PD1, and a second pad portion PD2. The fuse-blowing portion FC1 is formed between the first pad portion PD1 and the second pad portion PD2 in a first direction and is a rectangular shape having a first short side NS1 and a second short side NS2 along a second direction perpendicular to the first direction. The first pad portion PD1 has a width greater than the first short side NS1 in the second direction and is integrally formed with the fuse-blowing portion FC1 in a side of the first short side NS1. The second pad portion PD2 has a width greater than the second short side NS2 in the second direction and is integrally formed with the fuse-blowing portion FC1 in a side of the second short side NS2. The insulating film IL1 is formed on the electric fuse EF1. The insulating film IL1 is formed continuously between the first short side NS1 and the second short side NS2 to cover the surface of the fuse-blowing portion FC1. The insulating film IL2 is formed on the semiconductor substrate SB1 and is made of the same insulating material as the insulating film IL1. The insulating film IL2 is formed to planarly surround the insulating film IL1 and arranged at an interval from the insulating film IL1. The insulating film IL3 is formed to cover the electric fuse EF1, the insulating film IL1, and the insulating film IL2. Stresses of the insulating film IL1 and the insulating film IL2 are greater than a stress of the insulating film IL3.

In the following, description will be made on the semiconductor device SD1 according to the present embodiment in detail.

The semiconductor device SD1 includes the electric fuse EF1. The electric fuse EF1 is an electrical fusing type fuse which is blown by allowing a predetermined current to flow. In this case, the electric fuse EF1 is blown by flowing over-current to the electric fuse EF1 to break the electric fuse EF1 and increase a resistance to a high level. Redundant circuit can be set or resistance values or the like can be adjusted by blowing the electric fuse EF1.

Figure 5:
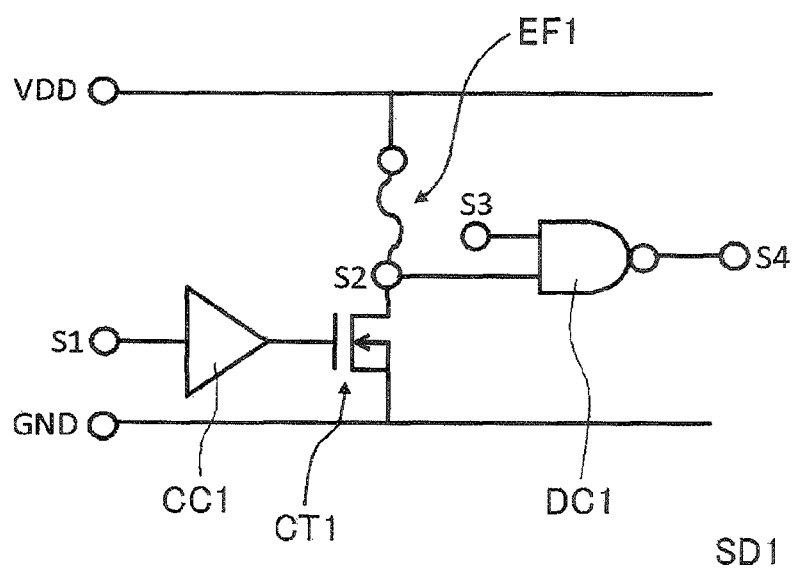
FIG. 5 is a circuit diagram illustrating the semiconductor device according to the first embodiment.

FIG. 5 is a circuit diagram illustrating the semiconductor device SD1 according to the present embodiment.

Operations of a fuse circuit using the electric fuse EF1 illustrated in FIG. 5 are performed as follows, for instance. First, a power source voltage VDD of the fuse circuit is started up after such a signal S1 that the blowing transistor CT1 is set to off, using the fuse control circuit CC1. In a case where it is intended to blow the electric fuse EF1 in such a state, the signal S1 executing the fuse blowing is input and the blowing transistor CT1 is turned on to thereby allow current to flow in the blowing transistor CT1 to fuse the electric fuse EF1. In a case where the electric fuse EF1 is blown, a signal having a LO level (GND) is output as a signal S2. On the other hand, in a case where the electric fuse EF1 is not blown, a signal having a HI level (VDD) is output as the signal S2. The signal S2 and a reference signal S3 are input to a fuse determination circuit DC1 and a final signal S4 is output to determine the presence or absence of fuse blowing. Adjustment of various characteristics of products is performed based on the final output signal S4. It should be noted that the fuse circuit constituting the semiconductor device SD1 is not limited to that shown in FIG. 5.

As shown in FIG. 2 and FIG. 3, the electric fuse EF1 is provided on, for instance, the semiconductor substrate SB1. The semiconductor substrate SB1 is, for instance, a silicon substrate or a compound semiconductor substrate. In the present embodiment, the electric fuse EF1 is arranged on, for instance, an element isolation region EI1 provided on the semiconductor substrate SB1. The element isolation region EI1 is configured by an insulator such as a silicon oxide film or the like, for instance. For that reason, it is possible to electrically isolate the electric fuse EF1 and the semiconductor substrate SB1 from each other. A method of forming the element isolation region EI1 is not especially limited, but may adopt, for instance, a shallow trench isolation (STI) method, a local oxidation of silicon (LOCOS), or the like.

As shown in FIG. 1, the electric fuse EF1 includes the fuse-blowing portion FC1, the first pad portion PD1 provided at one end of the fuse-blowing portion FC1, and the second pad portion PD2 provided at the other end opposite to the one end of the fuse-blowing portion FC1. The electric fuse EF1 is blown by, for instance, allowing a predetermined current to flow between the first pad portion PD1 and the second pad portion PD2, to blow the fuse-blowing portion FC1. Thus, an electrical fusing type fuse is realized.

The fuse-blowing portion FC1 is formed between the first pad portion PD1 and the second pad portion PD2 in the first direction. The fuse-blowing portion FC1 is provided to extend, for instance, in the first direction. For that reason, the fuse-blowing portion FC1 has a planar shape in which a length in the first direction is longer than a length in a second direction perpendicular to the first direction. In the present embodiment the first direction may be, for instance, a direction parallel to a substrate surface of a semiconductor substrate SB1 and the second direction may be a direction perpendicular to the first direction in in-plane direction parallel to the substrate surface of the semiconductor substrate SB1.

In the example illustrated in FIG. 1, the fuse-blowing portion FC1 has a planar shape of a rectangular shape. In this case, the fuse-blowing portion FC1 has a first long side LS1 and a second long side LS2 along the first direction and a first short side NS1 and a second short side NS2 along the second direction. The first long side LS1 and the second long side LS2 are sides longer than the first short side NS1 and the second short side NS2. The first short side NS1 and the second short side NS2 preferably have the same length, however, may have lengths different from each other. The first long side LS1 and the second long side LS2 preferably have the same length, however, may have lengths different from each other.

The lengths of the first short side NS1 and the second short side NS2 are not especially limited, but may be, for instance, greater than or equal to 0.15 µm and less than or equal to 2.0 µm. The lengths of the first long side LS1 and the second long side LS2 are not especially limited, but may be, for instance, greater than or equal to 2 µm and less than or equal to 10 µm.

The first pad portion PD1 has a width greater than the first short side NS1 of the fuse-blowing portion FC1 in the second direction. The second pad portion PD2 has a width greater than the second short side NS2 of the fuse-blowing portion FC1 in the second direction. This enables to ensure that a blown portion is generated in the fuse-blowing portion FC1 by increasing a temperature of the fuse-blowing portion FC1 when the electric fuse EF1 is blown by flowing current. The planar shape of the first pad portion PD1 and the second pad portion PD2 is not particularly limited, but may be, for instance, a rectangular shape.

The fuse-blowing portion FC1 may extend to connect the first pad portion PD1 and the second pad portion PD2 and may also include a curved portion or a corner portion within the planar shape. Also, in this case, the length of the fuse-blowing portion FC1 is made longer than the lengths of the first pad portion PD1 and the second pad portion PD2 in the direction perpendicular to the extending direction of the fuse-blowing portion FC1. This enables to generate the blown portion in the fuse-blowing portion FC1.

The first pad portion PD1 and the second pad portion PD2 are integrally formed with, for instance, the fuse-blowing portion FC1. That is, the first pad portion PD1 is integrally formed with the fuse-blowing portion FC1 in a side of the first short NS1 and the second pad portion PD2 is integrally formed with the fuse-blowing portion FC1 in a side of the second short NS2. This enables to form the fuse-blowing portion FC1, the first pad portion PD1, and the second pad portion PD2 by the same process. In this case, the first pad portion PD1, the second pad portion PD2, and the fuse-blowing portion FC1 are made of the same conductive material. On the other hand, the first pad portion PD1 and the second pad portion PD2 may be made of conductive material different from the fuse-blowing portion FC1.

The conductive material constituting the fuse-blowing portion FC1 is not especially limited, but can be appropriately selected according to required performance of the electric fuse EF1. The fuse-blowing portion FC1 may contain the conductive material having a higher thermal expansion coefficient than, for instance, $SiO_2$. This enables to sufficiently expand the fuse-blowing portion FC1, which has a higher thermal expansion coefficient than an interlayer configured of $SiO_2$, when a temperature of the fuse-blowing portion FC1 is increased by flowing current. This allows to ensure that a void is formed in the fuse-blowing portion FC1 when increasing a temperature to induce the blowing, to thereby enable a more stable blowing operation.

The present embodiment may include an aspect in which the electric fuse EF1 configured by the fuse-blowing portion FC1, the first pad portion PD1, and the second pad portion PD2 includes the polysilicon film, for instance. In the present embodiment, the electric fuse EF1 may be made of, for instance, the same material as a gate electrode constituting a MOS transistor formed on the semiconductor substrate SB1. Accordingly, the electric fuse EF1 can be formed together with the gate electrode.

Figure 6:
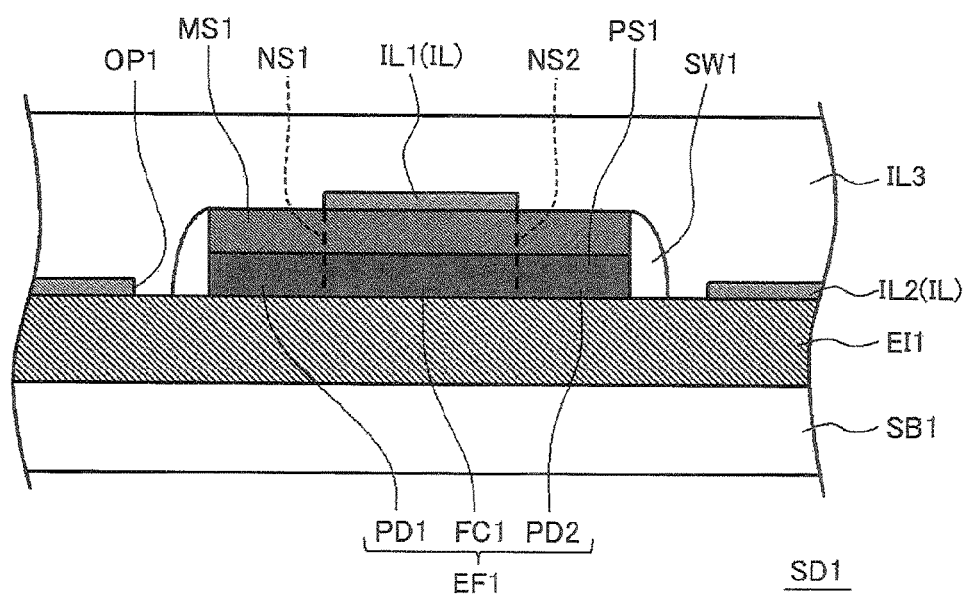
FIG. 6 is a sectional view illustrating a first modification example of the semiconductor device according to the first embodiment.

A thickness of the fuse-blowing portion FC1 is preferably, for instance, greater than or equal to 0.1 µm and less than or equal to 1.0 µm and, more preferably greater than or equal to 0.15 µm and less than or equal to 0.5 µm. As shown in FIG. 6, in a case where the fuse-blowing portion FC1 is formed by stacking a polysilicon film PS1 and a silicide film MS1 in order, the thickness of each film is preferably, for instance, greater than or equal to 0.05 µm and less than or equal to 0.9 µm and, more preferably greater than or equal to 0.1 µm and less than or equal to 0.5 µm.

A side wall SW1, for instance, may be formed on the side wall of the fuse-blowing portion FC1. The present embodiment may include an aspect in which the side wall SW1 is formed on each of the side wall of the fuse-blowing portion FC1, on the side wall of the first pad portion PD1, and on the side wall of the second pad portion PD2. The side wall SW1 is made of, for instance, insulating material. The insulating material constituting the side wall SW1 may include, for instance, one or two or more kinds of materials selected from $SiO_2$, SiN, and SiON.

The insulating film IL1 is formed on the electric fuse EF1. The insulating film IL1 is formed continuously between the first short side NS1 and the second short side NS2 to cover the surface of the fuse-blowing portion FC1. In the example illustrated in FIG. 1, the insulating film IL1 is provided on the fuse-blowing portion FC1 to cover the fuse-blowing portion FC1 throughout the first direction, for instance. As such, according to the present embodiment, the insulating film IL1 is formed to cover the fuse-blowing portion FC1 throughout between the first pad portion PD1 and the second pad portion PD2. This enables to prevent the void, which is to be generated in the fuse-blowing portion FC1 when the electric fuse EF1 is blown, from extending upward of the fuse-blowing portion FC1 by the insulating film IL1. Accordingly, damage to another interlayer located on the fuse-blowing portion FC1 can be prevented.

The insulating film IL1 is a film made of insulating material having a larger stress than an insulating film IL3 which will be described later. In the present embodiment, the insulating film IL1 is preferably made of an insulating film especially having a tensile stress. As such, the insulating film IL1 having a large tensile stress is formed on the fuse-blowing portion FC1 to thereby generate a pressing force acting from the insulating film IL1 to the fuse-blowing portion FC1. In this case, the void, which is to be generated in the fuse-blowing portion FC1 when blowing is induced, can be prevented from growing upwardly and can be promoted to grow in the lateral direction. This enables prevention of damage to the interlayer located on the fuse-blowing portion FC1. Promoting the growth of the void in the lateral direction allows increase of a size of the void after inducing the blowing to a sufficient level, to enable increase of the electrical resistance of the fuse-blowing portion FC1 to a sufficient level. This enables also improvement of reliability in the blowing operation of the electric fuse EF1.

The insulating film IL1 may contain, for instance, the insulating material having a higher thermal expansion coefficient than the insulating material constituting the insulating film IL3 which will be described later. In the present embodiment, the insulating film IL1 preferably contains insulating material having a higher thermal expansion coefficient than $SiO_2$, for instance. In a case where the insulating film IL1 having a high thermal expansion coefficient is formed on the fuse-blowing portion FC1, the insulating film IL1 expands greatly when current is allowed to flow in the fuse-blowing portion FC1 to cause a high temperature state, and as a result, the fuse-blowing portion FC1 receives a compression stress from the insulating film IL1. This allows to prevent upward expansion of the fuse-blowing portion FC1 and to promote expansion in the lateral direction or downward expansion. Accordingly, damage to the interlayer located on the fuse-blowing portion FC1 can be prevented. In the present embodiment, the thermal expansion coefficient of the insulating material constituting the insulating film IL1 is preferably, for instance, greater than or equal to 2.0 μm/K and less than or equal to 5.0 μm/K.

The insulating film IL1 is, for instance, a nitrogen-containing silicon film. Accordingly, the film stress, the thermal expansion coefficient or the like of the insulating film IL1 may be easily adjusted in a preferable size. Also, the insulating film IL1 may be formed along with forming the nitrogen-containing silicon film constituting a cover film which covers the gate electrode. Examples of the nitrogen-containing silicon film include any insulating film containing nitrogen and silicon, and may include one containing, for instance, one or two or more kinds of materials selected from SiN, SiON, and SiCN.

The thickness of the insulating film IL1 is not especially limited, but is preferably, for instance, greater than or equal to 5 nm and less than or equal to 50 nm and more preferably, greater than or equal to 10 nm and less than or equal to 30 nm. The planar shape of the insulating film IL1 is not especially limited, but may be, for instance, a rectangular shape.

In the example illustrated in FIG. 1, the length of the insulating film IL1 in the first direction is equal to the length of the fuse-blowing portion FC1 in the first direction. That is, one end of the insulating film IL1 in the first direction overlaps the first short side NS1 and the other end of the insulating film IL1 in the first direction overlaps the second short side NS2. In this case, the insulating film IL1 is located only on the fuse-blowing portion FC1, to thereby further facilitate variation in the position of the insulating film IL1 in an up and down direction, to enable to further relax the pressure caused by expansion of the fuse-blowing portion FC1 when inducing the blowing. On the other hand, as will be described later, the length of the insulating film IL1 in the first direction may also be longer than the length of the fuse-blowing portion FC1 in the first direction.

In the present embodiment, the insulating film IL1 is formed, for instance, not to cover the first pad portion PD1. FIG. 1 exemplifies a case where the entirety of the first pad portion PD1 and the entirety of the second pad portion PD2 are not covered by the insulating film IL1. In this case, the insulating film IL1 is located only on the fuse-blowing portion FC1, to further facilitate variation in the position of the insulating film IL1 in an up and down direction, to enable further relaxing the pressure caused by expansion of the fuse-blowing portion FC1 when inducing the blowing. On the other hand, as will be described later, the insulating film IL1 may also be formed to cover at least one of the first pad portion PD1 and the second pad portion PD2.

The insulating film IL1 is not formed on the side surface of the fuse-blowing portion FC1. That is, the side surface of the fuse-blowing portion FC1 is not covered by the insulating film IL1. This enables to ensure prevention of breakage of the insulating film IL1 caused by low adhesion of the insulating film IL1 located on the side surface of the fuse-blowing portion FC1. FIG. 1 exemplifies a case where the insulating film IL1 is not formed on any of two side surfaces of the fuse-blowing portion FC1 extending in the first direction.

In the example illustrated in FIG. 1, the length of the insulating film IL1 in the second direction is shorter than the length of the fuse-blowing portion FC1 in the second direction. This enables to secure a margin for patterning deviation when pattering the insulating film IL1 in a shape not covering sides of the fuse-blowing portion FC1. FIG. 1 illustrates an example in which one end of the insulating film IL1 in the second direction is located at a side inner than the first long side LS1 and the other end of the insulating film IL1 in the second direction is located at a side inner than the second long side LS2. On the other hand, any one of the one end and the other end of the insulating film IL1 in the second direction may also overlap the first long side LS1 or the second long side LS2. The present embodiment may include an aspect in which the length of the insulating film IL1 in the second direction is equal to the length of the fuse-blowing portion FC1 in the second direction.

As shown in FIG. 1, in a case where one side along the first direction of the insulating film IL1 is located at a side inner than the first long side LS1, a length L1 from the one side to the first long side LS1 is preferably greater than or equal to 0.1 μm and less than or equal to 0.3 μm. In a case where the other side along the first direction of the insulating film IL1 is located at a side inner than the second long side LS2, a length L2 from the other side to the second long side LS2 is preferably greater than or equal to 0.1 μm and less than or equal to 0.3 μm.

As shown in FIG. 3, when the side wall SW1 is formed on the side wall of the fuse-blowing portion FC1, the insulating film IL1 may be formed, for instance, not to planarly overlap with the side wall SW1 formed on the side wall of the fuse-blowing portion FC1. That is, the insulating film IL1 is not provided on the side wall SW1 formed on the side wall of the fuse-blowing portion FC1. There is a case where the side surface of the side wall SW1 not facing the fuse-blowing portion FC1, and the upper surface of the side wall SW1 are integrally formed to configure a curved surface. The insulating film IL1 formed on such a curved surface of the side wall SW1 has insufficient adhesion with the side wall SW1, and breakage along with the expansion of the fuse-blowing portion FC1 is a concern. According to the example shown in FIG. 3, the insulating film IL1 is formed not to be overlapped with the side wall SW1 formed on the side wall of the fuse-blowing portion FC1 to thereby enable prevention of the breakage of the insulating film IL1 based on such factors.

The insulating film IL2 is formed around the insulating film IL1 to planarly surround the insulating film IL1. That is, the insulating film IL2 does not include a region which overlaps the insulating film IL1 when seen in a plan view. In the examples illustrated in FIGS. 1 to 3, the insulating film IL2 is formed on the semiconductor substrate SB1 and the element isolation region EI1 provided on the semiconductor substrate SB1. In the present embodiment, the insulating film IL2 may function as, for instance, a cover film covering the gate electrode of a transistor provided on the semiconductor substrate SB1.

The insulating film IL2 is a film having a stress larger than the insulating film IL3 which will be described later. In the present embodiment, the insulating film IL2 is preferably configured by an insulating film especially having a tensile stress. In a case where the insulating film IL2 is the cover film covering the gate electrode, such an insulating film IL2 having the large film stress is adopted to thereby make it possible to generate stress on a channel region below the gate electrode and improve carrier mobility.

The insulating film IL2 is, for instance, a nitrogen-containing silicon film. Accordingly, the film stress or the like of the insulating film IL2 may be easily adjusted in a preferable size. Examples of the nitrogen-containing silicon film include any insulating film containing nitrogen and silicon, and may include one containing one or two or more kinds of materials selected from, for instance, SiN, SiON, and SiCN. In the present embodiment, the insulating film IL2 may be formed by, for instance, the same insulating material as the insulating film IL1. Accordingly, the insulating film IL1 and the insulating film IL2 may be deposited by the same process.

The insulating film IL2 is arranged at an interval from the insulating film IL1 in the first direction and the second direction. This enables to relax or remove the pressure which is received by the insulating film IL1 from the insulating film IL2 and which fixes the position of the insulating film IL1 in the up and down direction. This allows to facilitate variation in the position of the insulating film IL1 on the fuse-blowing portion FC1 in the up and down direction, to enable to sufficiently relax the pressure caused by expansion of the fuse-blowing portion FC1. This enables prevention of breakage of the insulating film IL1 caused by the expansion of the fuse-blowing portion FC1 when the electric fuse EF1 is blown. Since the insulating film IL2 is arranged at an interval from the insulating film IL1 in the second direction, it enables also to prevent covering the sides of the fuse-blowing portion FC1 with the insulating film IL1 or the insulating film IL2. This enables also prevention of the breakage of the insulating film IL1 or the insulating film IL2 caused by low adhesion of the insulating film located on the side surface of the fuse-blowing portion FC1.

In the present embodiment, the insulating film IL1 and the insulating film IL2 are preferably provided, for instance, in such a way that the entire periphery of the insulating film IL1 is provided at an interval from the insulating film IL2. This enables to ensure removing the pressure which is received by the insulating film IL1 from the insulating film IL2 and which fixes the position of the insulating film IL1 in the up and down direction.

As shown in FIG. 1, the insulating film IL2 includes, for instance, an opening OP1 inside of which the fuse-blowing portion FC1 is located. The insulating film IL1 is located, for instance, inward from the opening OP1 in the first direction and the second direction. In this case, since the insulating film IL1 is arranged at an interval from the insulating film IL2, it enables to relax or remove the pressure which is received by the insulating film IL1 from the insulating film IL2 and which fixes the position of the insulating film IL1 in the up and down direction. Since the insulating film IL2 is arranged at an interval from the insulating film IL1 in the second direction, it enables to prevent covering the sides of the fuse-blowing portion FC1 with the insulating film IL1 or the insulating film IL2. This enables prevention of the breakage of the insulating film IL1 or the insulating film IL2 caused by expansion of the fuse-blowing portion FC1 when the electric fuse EF1 is blown.

In the present embodiment, the insulating film IL1 and the insulating film IL2 are preferably provided, for instance, in such a way that the entire periphery of the insulating film IL1 is located inward from the opening OP1. This enables to ensure removing the pressure which is received by the insulating film IL1 from the insulating film IL2 and which fixes the position of the insulating film IL1 in the up and down direction. FIG. 1 exemplifies a case where the opening OP1 is provided such that the entire periphery of the insulating film IL1 is spaced apart from the insulating film IL2. In this case, the electric fuse EF1, the side wall SW1, the element isolation region EI1, the semiconductor substrate SB1, or a region where the insulating film IL4 which will be described later is formed is exposed from the insulating film IL1 and the insulating film IL2, over the entire periphery of the insulating film IL1 in the outside of the insulating film IL1.

In the present embodiment, the insulating film IL2 may be formed such that, for instance, the entirety of the first pad portion PD1 is not covered by the insulating film IL2. FIG. 1 exemplifies a case where the entirety of the first pad portion PD1 and the entirety of the second pad portion PD2 are not covered by the insulating film IL2. This enables to ensure preventing that undue pressure caused by the insulating film IL2 is applied to the electric fuse EF1. On the other hand, as will be described later, a portion of the first pad portion PD1 may be covered by the insulating film IL2.

As shown in FIG. 1, the insulating film IL2 is not provided on the side surface of the fuse-blowing portion FC1. That is, the side surface of the fuse-blowing portion FC1 is not covered by the insulating film IL2. This enables prevention of the breakage on the insulating film IL2 caused by low adhesion of the insulating film IL2 located on the side surface of the fuse-blowing portion FC1. FIG. 1 exemplifies a case where the insulating film IL2 is not formed on any of two side surfaces having the second direction of the fuse-blowing portion FC1 as a perpendicular direction.

As shown in FIG. 3, when the side wall SW1 is formed on the side wall of the fuse-blowing portion FC1, the insulating film IL2 may be formed, for instance, not to planarly overlap with the side wall SW1 formed on the side wall of the fuse-blowing portion FC1. That is, the insulating film IL2 is not provided on the side wall SW1 formed on the side wall of the fuse-blowing portion FC1. There is a case where the side surface of the side wall SW1 not facing the fuse-blowing portion FC1 and the upper surface of the side wall SW1 are integrally formed to configure a curved surface. The insulating film IL2 formed on such a curved surface of the side wall SW1 has insufficient adhesion, and breakage along with the expansion of the fuse-blowing portion FC1 is a concern. According to the example shown in FIG. 3, the insulating film IL2 is formed not to overlap with the side wall SW1 formed on the side wall of the fuse-blowing portion FC1 to thereby enable also prevention of the breakage of the insulating film IL2 based on such factors.

In a case where the insulating film IL1 and the insulating film IL2 are made of the same insulating material, the insulating film IL1 and the insulating film IL2 may be regarded as a single insulating film IL. That is, the insulating film IL is formed on the fuse-blowing portion FC1 and the periphery of the fuse-blowing portion FC1 to cover the fuse-blowing portion FC1 throughout the first direction. In such a case, the opening OP1 is formed, for instance, on both sides in the second direction of the fuse-blowing portion FC1 in the insulating film IL. This enables to prevent covering the sides of the fuse-blowing portion FC1 with the insulating film IL. This enables prevention of the breakage on the insulating film IL caused by low adhesion of the insulating film located on the side surface of the fuse-blowing portion FC1.

FIG. 1 exemplifies a case where at least a portion of the first pad portion PD1 is not covered by the insulating film IL. That is, the opening OP1 is formed on a portion located on the first pad portion PD1 close to the fuse-blowing portion FC1 in the insulating film IL. This enables to relax or remove the pressure which is received by a portion of the insulating film IL located on the fuse-blowing portion FC1 from a portion of the insulating film IL located around the electric fuse EF1 and which fixes the position in the up and down direction. This enables prevention of the breakage of the insulating film IL caused by the expansion of the fuse-blowing portion FC1 when the electric fuse EF1 is blown. In the present embodiment, an aspect is more preferable, for instance, in which at least a portion of the first pad portion PD1 and at least a portion of the second pad portion PD2 are not covered by the insulating film IL.

In the present embodiment, the insulating film IL1 may be formed such that the insulating film IL includes a first portion which is provided on the fuse-blowing portion FC1 to cover the fuse-blowing portion FC1 throughout the first direction and a second portion which is provided to be located apart from the first portion around the fuse-blowing portion FC1. This enables to relax or remove the pressure which is received by the first portion located on the fuse-blowing portion FC1 from the second portion and which fixes the position in the up and down direction. This enables prevention of the breakage of the first portion caused by the expansion of the fuse-blowing portion FC1. In FIG. 1, the insulating film IL1 and the insulating film IL2 correspond to the first portion and the second portion, respectively.

In the present embodiment, the insulating film IL may be formed, for instance, such that the entirety of the first pad portion PD1 is not covered by the insulating film IL. FIG. 1 exemplifies a case where the entirety of the first pad portion PD1 and the entirety of the second pad portion PD2 are not covered by the insulating film IL. This enables to ensure preventing that undue pressure caused by the insulating film IL from is applied to the electric fuse EF1. As will be described later, the first pad portion PD1 and a portion of the first pad portion PD1 may be covered by the insulating film IL.

The insulating film IL3 is formed to cover the electric fuse EF1, the insulating film IL1, and the insulating film IL2. That is, a region of the electric fuse EF1 not covered by the insulating film IL1 and the insulating film IL2 is in contact with the insulating film IL3.

The insulating film IL3 is configured by, for instance, an oxygen-containing silicon film. Accordingly, a dielectric constant of an insulating interlayer may be decreased. Also, the thermal expansion, the film stress, or the like of the insulating film IL3 may be decreased to a level lower than that of the insulating film IL1 or the insulating film IL2. Examples of the oxygen-containing silicon film constituting the insulating film IL3 include a film having less nitrogen content than the nitrogen-containing silicon film constituting the insulating film IL1 and the insulating film IL2. Examples of the oxygen-containing silicon film include any insulating film containing oxygen and silicon, and may include, for instance, an insulating film containing $SiO_2$. The thermal expansion coefficient of the insulating material constituting the insulating film IL3 may be, for instance, greater than or equal to 0.1 μm/K and less than or equal to 1.0 μm/K.

Figure 4:
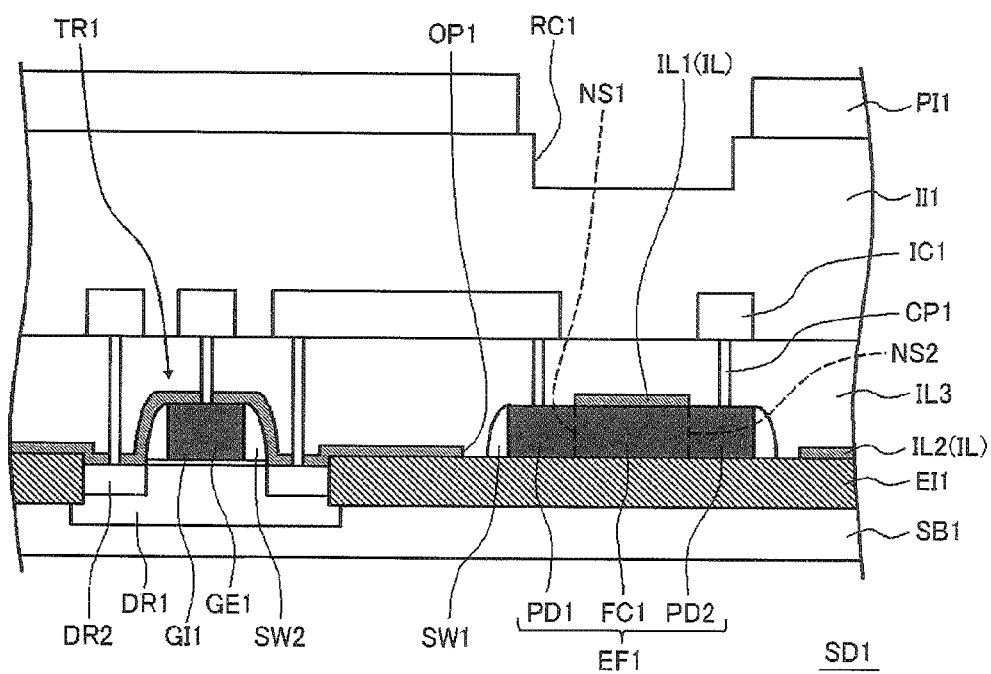
FIG. 4 is still another sectional view illustrating the semiconductor device according to the first embodiment.

FIG. 4 is a sectional view illustrating the semiconductor device SD1 according to the present embodiment.

FIG. 4 exemplifies a semiconductor device SD1 including a semiconductor substrate SB1, and a transistor TR1 and the electric fuse EF1 provided on the semiconductor substrate SB1. The transistor TR1 is formed on a region of the semiconductor substrate SB1 where the element isolation region EI1 is not formed. The transistor TR1 includes a gate insulating film GI1 provided on the semiconductor substrate SB1, a gate electrode GE1 provided on the gate insulating film GI1, and a side wall SW2 provided on the side surface of the gate electrode GE1. An impurity diffusion region DR1 constituting a low concentration impurity layer functioning as a well region is provided on a region of the semiconductor substrate SB1 including the transistor TR1 when seen in a plan view. The impurity diffusion region DR1 is made of P-type impurities, for instance. An impurity diffusion region DR2 constituting a high concentration impurity layer functioning as a source region and a drain region of the transistor TR1 is provided in the impurity diffusion region DR1. The impurity diffusion region DR2 is made of N-type impurities, for instance.

The gate electrode GE1 may be made of the same conductive material as the fuse-blowing portion FC1, for instance. In this case, the fuse-blowing portion FC1 may be formed at the same time as formation of the gate electrode GE1. In the present embodiment, the gate electrode GE1 may be configured by a polysilicon film or stacked films of a polysilicon film and a silicide film, for instance. The side wall SW2 may be made of the same conductive material as the side wall SW1, for instance. In this case, the side wall SW1 on the side surface of the fuse-blowing portion FC1 may be formed at the same time as formation of the side wall SW2.

In the present embodiment, the insulating film IL2 can be formed on the semiconductor substrate SB1, for instance, to cover the gate electrode GE1. Forming the insulating film IL2 by a film with a high tensile stress enables to generate a stress to a channel region formed below the gate electrode GE1 and to improve carrier mobility. FIG. 4 exemplifies a case where the insulating film IL2 is formed to cover, for instance, the gate electrode GE1 and the side wall SW2. In the present embodiment, the insulating film IL2 is preferably formed to cover the entirety of the semiconductor substrate SB1 except for, for example, a region where the opening OP1 is provided. Limiting the region where the opening OP1 is provided to the region where the electric fuse EF1 enables to ensure preventing infiltration of moisture from the upper surface of the chip on a region other than the region, and to reduce the influence on the change in characteristic of the transistor TR1 or the like due to moisture, to thereby improve moisture resistant reliability of the semiconductor device. The electric fuse EF1, as will be described later, is a resistor element including the polysilicon film PS1 and the silicide film MS1 formed on the polysilicon film PS1 and thus, it is considered that the influence of the change in characteristic due to moisture is small and degradation in moisture resistant reliability due to provision of the opening OP1 is small.

In the insulating film IL3, a plurality of contact plugs CP1 for supplying potential to the electric fuse EF1 are formed. Among the contact plugs CP1, the first contact plug CP1 is connected to the first pad portion PD1 and the second contact plug CP1 is connected to the second pad portion PD2. Accordingly, current may be flown to the electric fuse EF1. In the insulating film IL3, other contact plugs CP1 connected to the gate electrode GE1 and the impurity diffusion region DR2 are buried, for instance.

On the insulating film IL3, an interconnect IC1 is formed, for instance. The interconnect IC1 is electrically connected to the first pad portion PD1 and the second pad portion PD2, for instance, through the contact plug CP1 buried in the insulating film IL3. In a case where the transistor TR1 is formed on the semiconductor substrate SB1, the interconnect IC1 is electrically connected to the gate electrode GE1 or the impurity diffusion region DR2, for instance, through the contact plug CP1. FIG. 4 exemplifies a case where the impurity diffusion region DR2 of the transistor TR1 and the first pad portion PD1 of the electric fuse EF1 are electrically connected to each other, for instance, through the interconnect IC1 and the contact plug CP1. The interconnect IC1 contains metal material, for instance, Cu or Al. The contact plug CP1 contains metal material, for instance, W.

On the insulating film IL3, an insulating interlayer II1 is formed. The insulating interlayer II1 may constitute a multilayer interconnect structure formed with multiple layers on, for instance, the insulating film IL3. In this case, a plurality of interconnect layers are formed in the insulating interlayer II1. A recessed portion RC1, for instance, may be formed in the region of the insulating interlayer II1 overlapping the electric fuse EF1 when seen in a plan view. Accordingly, a heat dissipation capability of the electric fuse EF1 may be improved. On the insulating interlayer II1, a polyimide film PI1 which is a surface protection film is formed, for instance. The surface protection film may be made of the insulating material other than polyimide.

Next, description will be made on a manufacturing method of semiconductor device SD1.

FIGS. 10 to 13 are sectional views illustrating the manufacturing method of the semiconductor device SD1 shown in FIG. 4. The manufacturing method of the semiconductor device SD1 may be performed as follows. First, the electric fuse EF1 is formed on the semiconductor substrate SB1. The electric fuse EF1 is configured by the fuse-blowing portion FC1 extending in the first direction, the first pad portion PD1 which is connected to one end of the fuse-blowing portion FC1 and of which the width in the second direction perpendicular to the first direction is greater than the fuse-blowing portion FC1, and the second pad portion PD2 which is connected to another end opposite to the one end of the fuse-blowing portion FC1 and of which the width in the second direction is greater than the fuse-blowing portion FC1. Next, the insulating film IL is formed on the semiconductor substrate SB1 to cover the electric fuse EF1. Next, the insulating film IL is patterned. Next, the insulating film IL3 is formed on the insulating film IL.

In the following, descriptions will be made on the manufacturing method of the semiconductor device SD1 in detail.

First, as shown in FIG. 10(a), the element isolation region EI1 is formed on the semiconductor substrate SB1. A method of forming the element isolation region EI1 is not especially limited, but may adopt, for instance, a STI method, a LOCOS method, or the like.

Next, as shown in FIG. 10(b), the impurity diffusion region DR1 is formed in the region of the semiconductor substrate SB1 where the transistor TR1 is formed. In a case where the transistor TR1 is a Nch MOS transistor, the impurity diffusion region DR2 is made of P-type impurities. Next, the gate insulating film GI1 is formed on the semiconductor substrate SB1.

Next, as shown in FIG. 11(a), the gate electrode GE1 and the electric fuse EF1 are formed. The gate electrode GE1 and the electric fuse EF1 are formed simultaneously, for instance, by patterning the conductive film formed on the semiconductor substrate SB1 and the element isolation region EI1 using lithography and etching. On the other hand, the electric fuse EF1 may be formed by a process different from the gate electrode GE1. In this case, the conductive material constituting the electric fuse EF1 may be selected independently from the material of the gate electrode GE1.

Next, as shown in FIG. 11(b), the side wall SW2 is formed on the side surface of the gate electrode GE1 and the side wall SW1 is formed on the side surface of the electric fuse EF1. The side wall SW1 and the side wall SW2 may be formed by etching back an insulating film which covers the gate electrode GE1 and the electric fuse EF1, for instance, after forming the insulating film on the semiconductor substrate SB1.

Next, as shown in FIG. 12(a), the impurity diffusion region DR2 constituting the source and drain regions of the transistor TR1 is formed. In a case where the transistor TR1 is an Nch MOS transistor, the impurity diffusion region DR2 is made of N-type impurities.

Next, as shown in FIG. 12(b), the insulating film IL is formed on the semiconductor substrate SB1 to cover the electric fuse EF1 and transistor TR1. The insulating film IL is made of, for instance, insulating material constituting the insulating film IL1 and the insulating film IL2 illustrated in the above description. In the present embodiment, the insulating film IL may be formed with, for instance, the nitrogen-containing silicon film. FIG. 12(b) exemplifies a case where the insulating film IL is formed to contact the gate electrode GE1 and the electric fuse EF1. On the other hand, the insulating film IL4 which will be described later may be formed below the insulating film IL so as to cover the gate electrode GE1 and the electric fuse EF1.

Next, as shown in FIG. 13(a), the insulating film IL is patterned.

The insulating film IL may be patterned by, for instance, to form a first portion including the opening OP1 in which the fuse-blowing portion FC1 is located and a second portion located on the fuse-blowing portion FC1 to cover the fuse-blowing portion FC1 throughout the first direction and located inward from the opening OP1 in the first direction and the second direction. In this case, the first portion and the second portion constitute the insulating film IL2 and the insulating film IL1, respectively. The insulating film IL1 is formed at an interval from the insulating film IL2.

The insulating film IL may also be patterned by, for instance, in such a way that the patterned insulating film IL is positioned on the fuse-blowing portion FC1 to cover the fuse-blowing portion FC1 throughout the first direction and includes the opening OP1 on both sides in the second direction of the fuse-blowing portion FC1 and at least a portion of the first pad portion PD1. In the present embodiment, the respective openings OP1 are formed in the insulating film IL, for instance, on at least a portion of the first pad portion PD1 and at least a portion of the second pad portion PD2. The openings OP1 provided on each of the first pad portion PD1, the second pad portion PD2, and both sides in the second direction of the fuse-blowing portion FC1 are formed continuously with each other, for instance.

Next, as shown in FIG. 13(b), the insulating film IL3 is formed on the insulating film IL. FIG. 13(b) exemplifies a case where the insulating film IL3 is formed on each of the insulating film IL and the region which is not covered by the insulating film IL of each of the electric fuse EF1, the side wall SW1, and the element isolation region EI1.

Thereafter, the contact plug connected to the electric fuse EF1 and the contact plug connected to the transistor TR1 are formed in the insulating film IL3. Next, the multilayer interconnect structure is formed on the insulating film IL3.

The semiconductor device SD1 according to the present embodiment is manufactured, for instance, in this manner.

FIG. 6 is a sectional view illustrating a first modification example of the semiconductor device SD1 according to the present embodiment.

In the example illustrated in FIG. 6, the electric fuse EF1 includes the polysilicon film PS1 and the silicide film MS1 formed on the polysilicon film PS1. Accordingly, more reliable blowing operation is possible. Examples of metal materials contained in the silicide film MS1 include, for instance, W (tungsten), Mo (molybdenum), Ti (titanium), Co (cobalt), Ni (nickel) and the like.

Figure 7:
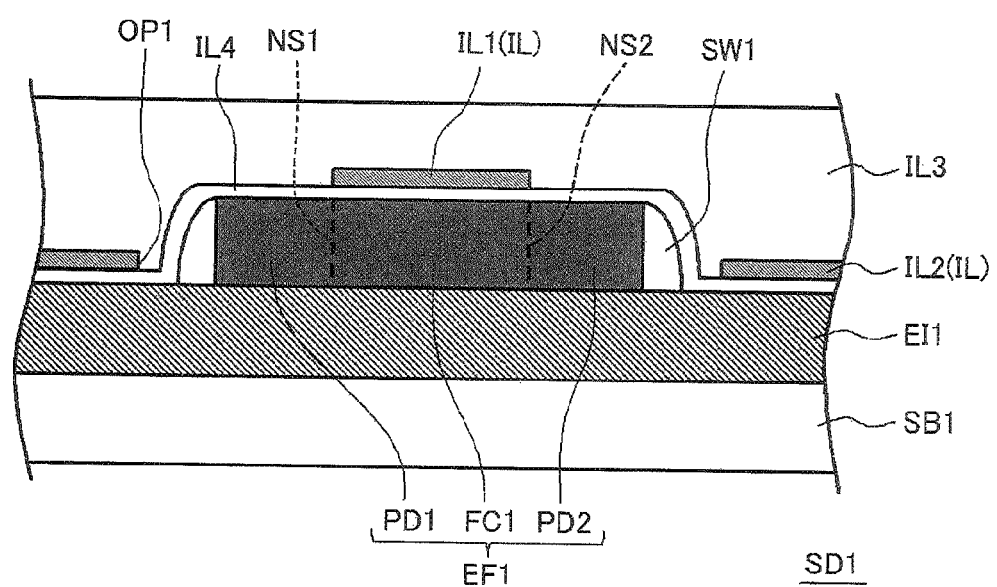
FIG. 7 is a sectional view illustrating a second modification example of the semiconductor device according to the first embodiment.

FIG. 7 is a sectional view illustrating a second modification example of the semiconductor device SD1 according to the first embodiment and illustrates an example different from FIG. 6.

FIG. 7 exemplifies a case where an insulating film IL4 which covers the electric fuse EF1 is formed below the insulating film IL1 and the insulating film IL2. The insulating material constituting the insulating film IL4 may be, for instance, an oxygen-containing silicon film, but not limited thereto. Examples of the silicon film containing oxygen constituting the insulating film IL4 may include any film containing oxygen and silicon, and may include, for instance, one containing $SiO_2$. The insulating film IL4 is formed on the semiconductor substrate SB1, for instance, to cover the entirety of each of the fuse-blowing portion FC1, the first pad portion PD1, and the second pad portion PD2.

The semiconductor device SD1 according to the present modification example may be realized, for instance, by performing the process of forming the insulating film IL4 which covers the electric fuse EF1 after the process of forming the electric fuse EF1 and before the process of forming the insulating film IL.

Figure 8:
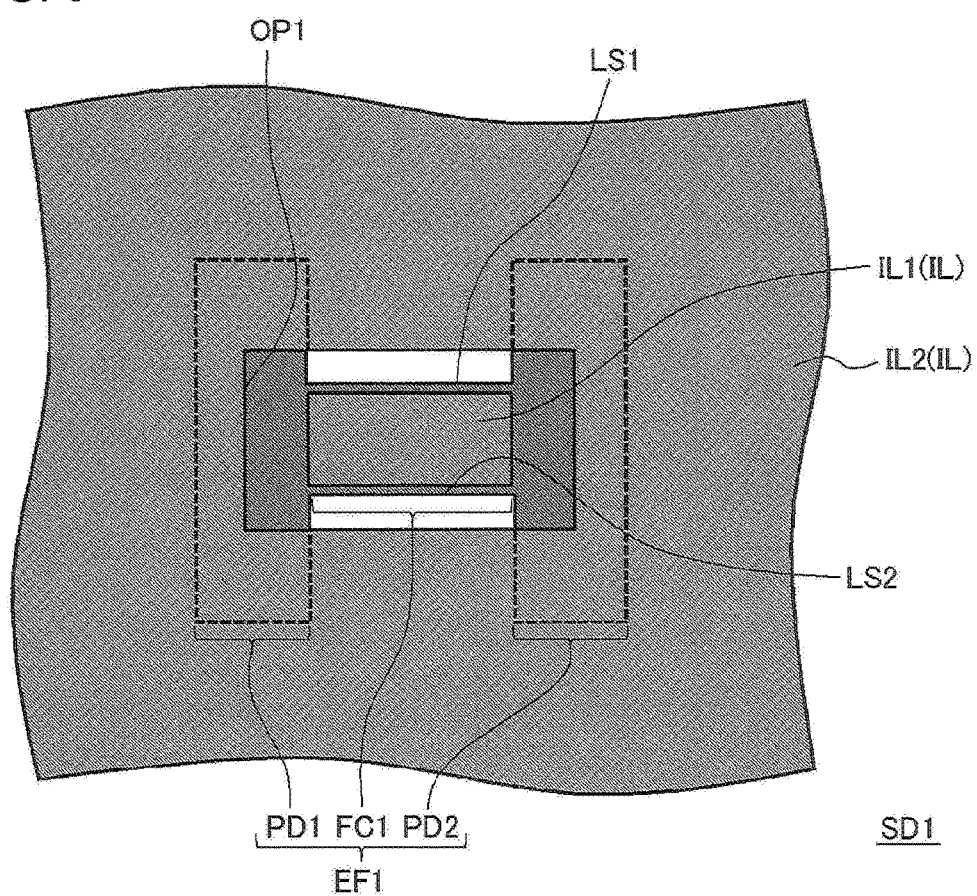
FIG. 8 is a plan view illustrating a third modification example of the semiconductor device according to the first embodiment.

FIG. 8 is a plan view illustrating a third modification example of the semiconductor device SD1 according to the present embodiment and illustrates an example different from FIGS. 6 and 7.

FIG. 8 exemplifies a case where a portion of the first pad portion PD1 and a portion of the second pad portion PD2 are covered by the insulating film IL2. In this case, the insulating film IL2 is formed not to cover the other portion of the first pad portion PD1 and the other portion of the second pad portion PD2.

Next, the blowing operation of the electric fuse EF1 will be described.

The electric fuse EF1 is blown by, for instance, allowing a predetermined current to flow between the first pad portion PD1 and the second pad portion PD2 to generate a void in the fuse-blowing portion FC1 and make the electrical resistance of the fuse-blowing portion FC1 high. In the following, descriptions will be made in detail.

First, a temperature of the fuse-blowing portion FC1 is raised and subjected to thermal expansion by allowing the predetermined current to flow between the first pad portion PD1 and the second pad portion PD2. In this case, a value of the voltage to be applied between the first pad portion PD1 and the second pad portion PD2 may be appropriately controlled according to a resistance value of the blown electric fuse EF1. In the present embodiment, the electric fuse EF1 may be blown by a high voltage greater than or equal to 5.0 V, for instance, but not limited thereto. From the viewpoint that more stable blowing is performed, it is more preferable to perform the blowing operation by a voltage of greater than or equal to 5.5 V and less than or equal to 10 V. When the temperature of the fuse-blowing portion FC1 reaches a melting point due to temperature rise, melting occurs in the fuse-blowing portion FC1. In the present embodiment, the melting point of the fuse-blowing portion FC1 is lower than the melting point of a peripheral insulating film such as the insulating film IL1 or the insulating film IL3 and thus, only the fuse-blowing portion FC1 is melted. Next, the melted fuse-blowing portion FC1 moves in an expanded region and is re-crystallized and thus, the resistance becomes higher. The volume of the fuse-blowing portion FC1 after re-crystallization becomes smaller than that at the time of expansion and thus, a void where nothing exists is formed in the expanded region. Such a void is formed to thereby make it possible to further increase the resistance of the blown electric fuse EF1. In the present embodiment, the electric fuse EF1 is blown in this manner, for instance.

In the present embodiment, it is particularly preferable to make the resistance value of the blown electric fuse EF1 greater than or equal to 1 GΩ, for instance, from the viewpoint of improvement of reliability of the semiconductor device. In order to allow the blown electric fuse EF1 to be in a high resistive state of being greater than or equal to 1 GΩ, for instance, the blowing operation by a high voltage greater than or equal to 5.0 V is necessary. The electric fuse EF1 according to the present embodiment enables prevention of damage to the interlayer in the blowing operation even with such high voltage. Furthermore, setting the blowing voltage to such a high level allows increase of a size of the void, which is to remain in the blown fuse-blowing portion FC1, to a high level, to enable improvement of blowing yield of the electric fuse EF1. Furthermore, a layout size of the entirety of the fuse circuit can be reduced by decreasing a size of the blowing transistor connected to the electric fuse EF1.

Figure 9:
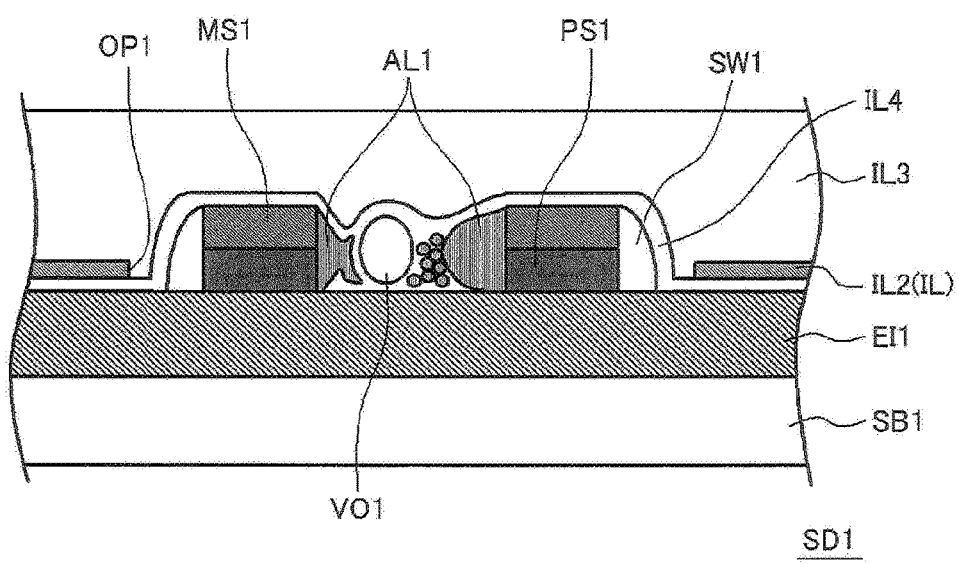
FIG. 9 is a sectional view illustrating an example of a structure of a blown electric fuse.

FIG. 9 is a sectional view illustrating an example of a structure of the blown electric fuse EF1.

FIG. 9 exemplifies a blowing structure in a case where the fuse-blowing portion FC1 includes the polysilicon film PS1 and the silicide film MS1 and includes the insulating film IL4. In this case, electro-migration occurs in the silicide film MS1 according to temperature rise of the fuse-blowing portion FC1 and thus, the silicide film MS1 is mixed with the polysilicon film PS1 to generate an alloy portion AL1. The alloy portion AL1 is molten and expansion of the fuse-blowing portion FC1 progresses and thus, a void VO1 is generated in the fuse-blowing portion FC1 as described above.

As described above, the void VO1 remains in the blown fuse-blowing portion FC1. FIG. 9 exemplifies a case where a portion of the insulating film IL1 located at least on the region where the void VO1 is generated is incorporated into other insulating films such as the insulating film IL4 and does not remain on the blown fuse-blowing portion FC1. In this case, the other portion of the insulating film IL1 may also not remain on the fuse-blowing portion FC1, but may also remain on the fuse-blowing portion FC1. Such a blown structure can be realized by appropriately select conditions such as a voltage when the electric fuse EF1 is blown.

Around at least the void VO1 in the fuse-blowing portion FC1, for instance, the alloy portion AL1 formed by mixing the silicide film MS1 and the polysilicon film PS1 remains.

Second Embodiment

Figure 14:
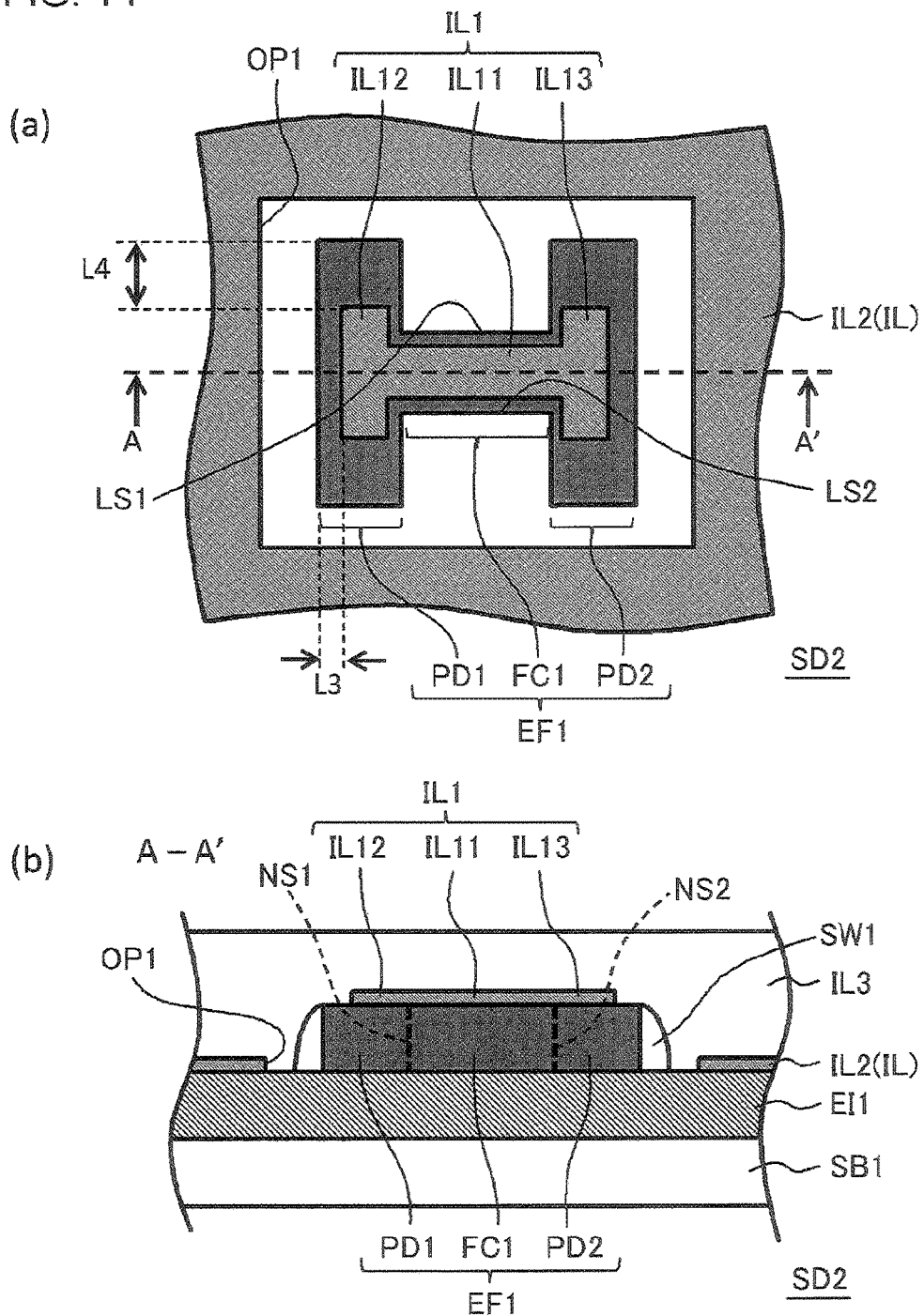
FIG. 14 is a diagram illustrating a semiconductor device according to a second embodiment.

FIG. 14 is a diagram illustrating a semiconductor device SD2 according to a second embodiment. FIG. 14(a) and FIG. 14(b) illustrate a plan view and a section taken along the line A-A' in FIG. 14(a), respectively.

In the semiconductor device SD2 according to the present embodiment, the insulating film IL1 is formed on the fuse-blowing portion FC1 and also on the first pad portion PD1 and the second pad portion PD2. Except for this point, the semiconductor device SD2 according to the present embodiment may have the similar configuration as the semiconductor device SD1 according to the first embodiment.

In the following, description will be made on the semiconductor device SD2 in detail.

In the semiconductor device SD2 according to the present embodiment, the insulating film IL1 is provided on the fuse-blowing portion FC1, the first pad portion PD1, and the second pad portion PD2. That is, the insulating film IL1 is configured by a portion IL11 provided on the fuse-blowing portion FC1, a portion IL12 provided on the first pad portion PD1, and a portion IL13 provided on the second pad portion PD2. This enables to effectively generate the pressure applied from the insulating film IL1 to the fuse-blowing portion FC1 and contribute to stable formation of the void. This also enables to secure a margin for patterning deviation when patterning of the insulating film IL1 is performed to cover the entirety of the fuse-blowing portion FC1. The portion IL11 provided on the fuse-blowing portion FC1, the portion IL12 provided on the first pad portion PD1, and the portion IL13 provided on the second pad portion PD2 of the insulating film IL1 are provided continuously with each other.

In the present embodiment, the length of the insulating film IL1 in the first direction is longer than the length of the fuse-blowing portion FC1 in the first direction. Accordingly, the insulating film IL1 may be formed to continue on the fuse-blowing portion FC1, the first pad portion PD1, and the second pad portion PD2.

As shown in FIG. 14(a) and FIG. 14(b), the insulating film IL1 may be formed, for instance, to cover a portion of the first pad portion PD1 and not to cover the other portion of the first pad portion PD1. This enables limitation of an area formed on the first pad portion PD1 to less than or equal to a predetermined value, to thereby further facilitate variation in the position of the fuse-blowing portion FC1 in the up and down direction. This enables to reliably prevent that the insulating film IL1 on the fuse-blowing portion FC1 is broken along with expansion of the fuse-blowing portion FC1.

In the structure illustrated in FIG. 14(a), the shortest length L3 in the first direction between one side of the first pad portion PD1, which is a side of two sides of the first pad portion PD1 along the second direction and is not in contact with the fuse-blowing portion FC1, and the portion IL12 may be greater than or equal to 1 μm and less than or equal to 12 μm. The shortest length L4 in the second direction between one side along the first direction of the first pad portion PD1 and one side along the first direction of the portion IL12 adjacent thereto may be greater than or equal to 1 μm and less than or equal to 5 μm.

The planar shape of the insulating film IL1 is not especially limited. In the present embodiment, as shown in FIG. 14(a), the insulating film IL1 may have, for instance, a planar shape including one portion which extends in the first direction to cover the fuse-blowing portion FC1 and the other portion formed to extend from at least one of one end and the other end of the one portion to at least one side of the second direction. On the other hand, the insulating film IL1 may have a planar shape configured only by the portion extending in the first direction to cover the fuse-blowing portion FC1.

Figure 15:
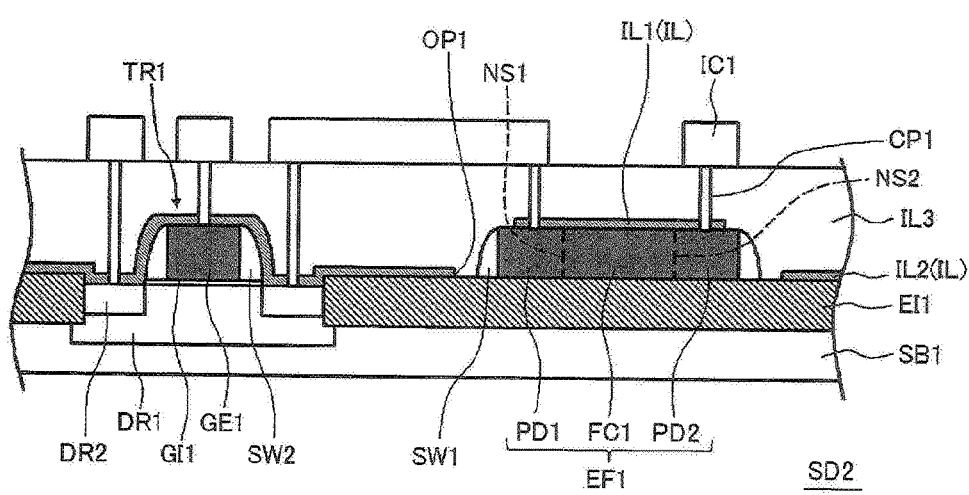
FIG. 15 is a sectional view illustrating the semiconductor device according to the second embodiment.
Figure 21:
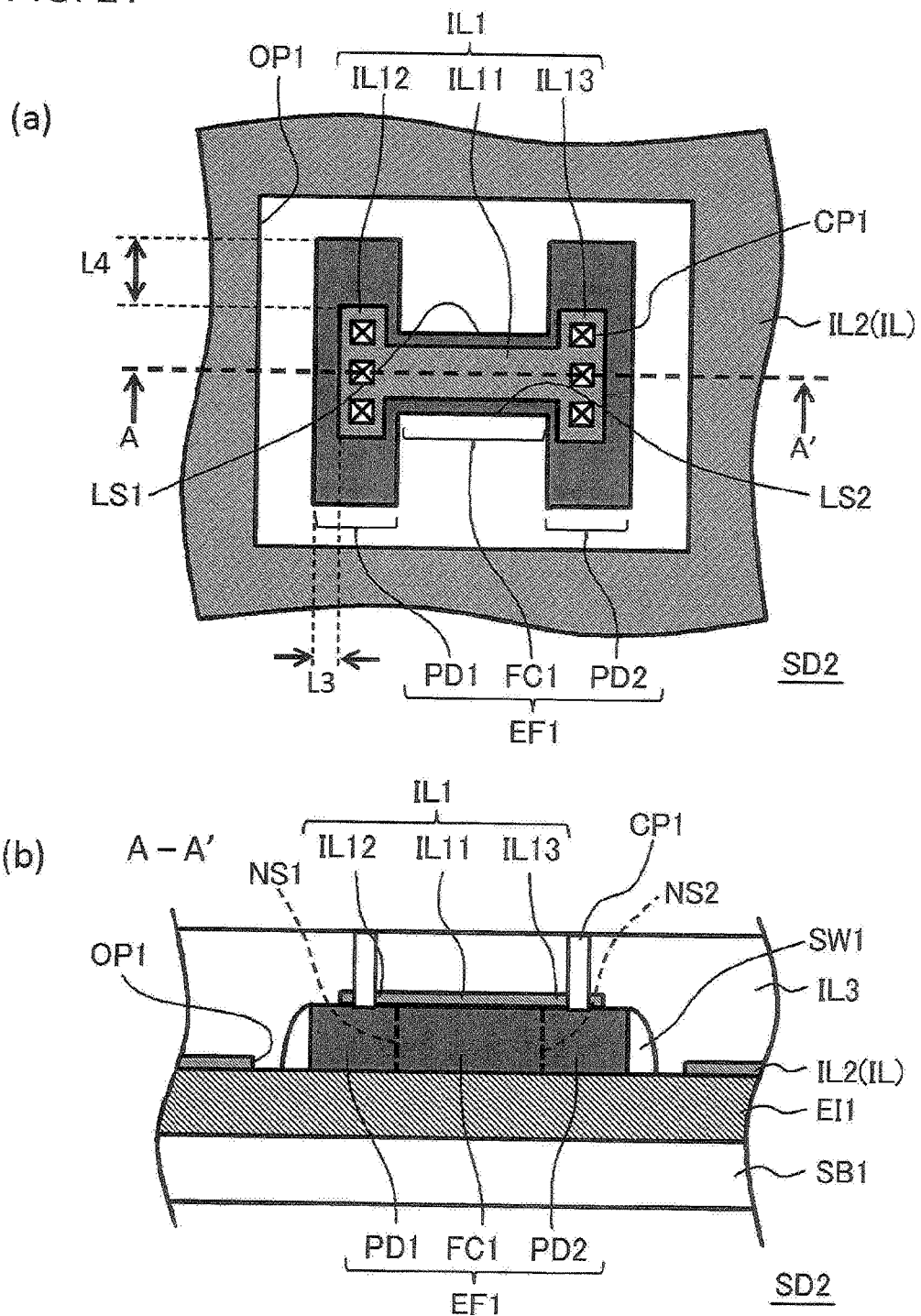
FIG. 21 is a diagram illustrating a configuration of an electric fuse of the semiconductor device shown in FIG. 15.

FIG. 15 is a sectional view illustrating the semiconductor device SD2 according to the present embodiment. FIG. 21 is a diagram illustrating a configuration of the electric fuse EF1 of the semiconductor device SD2 illustrated in FIG. 15. FIG. 21(a) and FIG. 21(b) illustrate a plan view and a section taken along the line A-A' in FIG. 21(a), respectively.

FIG. 15 and FIG. 21 exemplify a case where a lower portion of a plurality of contact plugs CP1 connected to the electric fuse EF1 is surrounded by the insulating film IL1. This enables the insulating film IL1 to function as an etching stopper film when a contact hole into which the contact plug CP1 is buried is formed in the insulating film IL3. In a case where the insulating film IL2 covers a portion of the first pad portion PD1 and a portion of the second pad portion PD2, the lower portion of the plurality of contact plugs CP1 connected to the electric fuse EF1 may also be surrounded by the insulating film IL2. Also, in this case, the similar effect may be obtained.

FIG. 16 is a diagram illustrating a first modification example of the semiconductor device SD2 shown in FIG. 15. FIG. 16(a) and FIG. 16(b) illustrate a plan view and a section taken along the line A-A' in FIG. 16(a), respectively.

FIG. 16 exemplifies a case where the entirety of the first pad portion PD1 and the entirety of the second pad portion PD2 are covered by the insulating film IL1. In the present modification example, the planar shape of the portion IL12 of the insulating film IL1 provided on the first pad portion PD1 coincides with the planar shape of the first pad portion PD1. The planar shape of the portion IL13 of the insulating film IL1 provided on the second pad portion PD2 coincides with the planar shape of the second pad portion PD2. Also, in such a case, the insulating film IL1 is arranged at an interval from the insulating film IL2, to thereby enable to relax or remove the pressure which is received by the insulating film IL1 from the insulating film IL2 and which fixes the position of the insulating film IL1 in the up and down direction.

Figure 17:
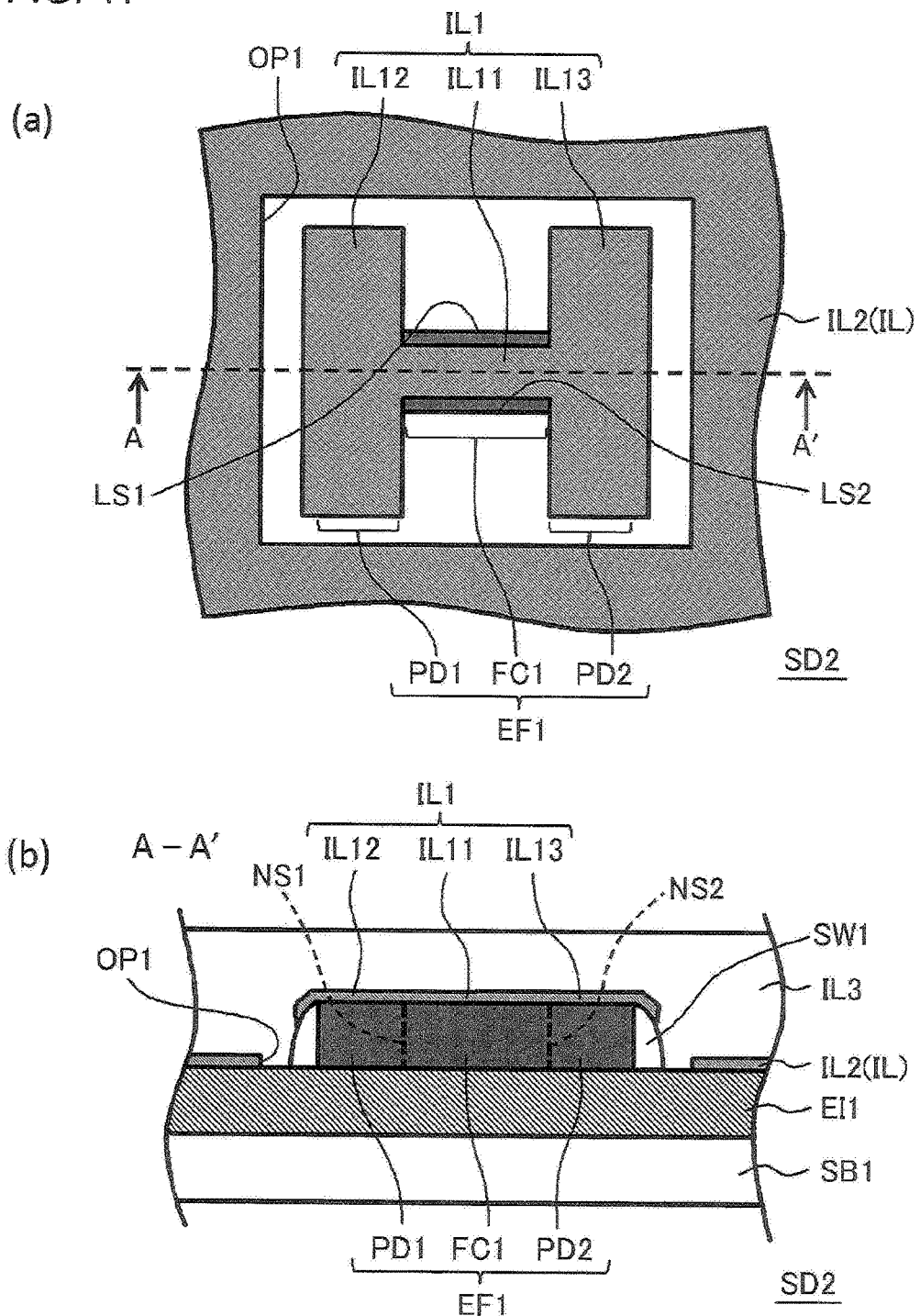
FIG. 17 is a diagram illustrating the second modification example of the semiconductor device shown in FIG. 15.

FIG. 17 is a diagram illustrating a second modification example of the semiconductor device SD2 shown in FIG. 15 and illustrates an example different from FIG. 16. FIG. 17(a) and FIG. 17(b) illustrate a plan view and a section taken along the line A-A' in FIG. 17(a), respectively.

FIG. 17 exemplifies a case where the entirety of the first pad portion PD1, the entirety of the second pad portion PD2, and the side wall SW1 provided on the side surface of each of the first pad portion PD1 and the second pad portion PD2 are covered by the insulating film IL1. In this case, the insulating film IL1 may be formed such that the side wall SW1 formed on the side surface of the fuse-blowing portion FC1 does not overlap the insulating film IL1 when seen in a plan view. Also, in this case, the insulating film IL1 is arranged at an interval from the insulating film IL2, to thereby enable to relax or remove the pressure which is received by the insulating film IL1 from the insulating film IL2 and which fixes the position of the insulating film IL1 in the up and down direction. Only the side wall SW1 provided on the side surface of one of the first pad portion PD1 and the second pad portion PD2 may also be covered by the insulating film IL1.

Also, in the present embodiment, the similar effect as the first embodiment may be obtained.

Third Embodiment

Figure 18:
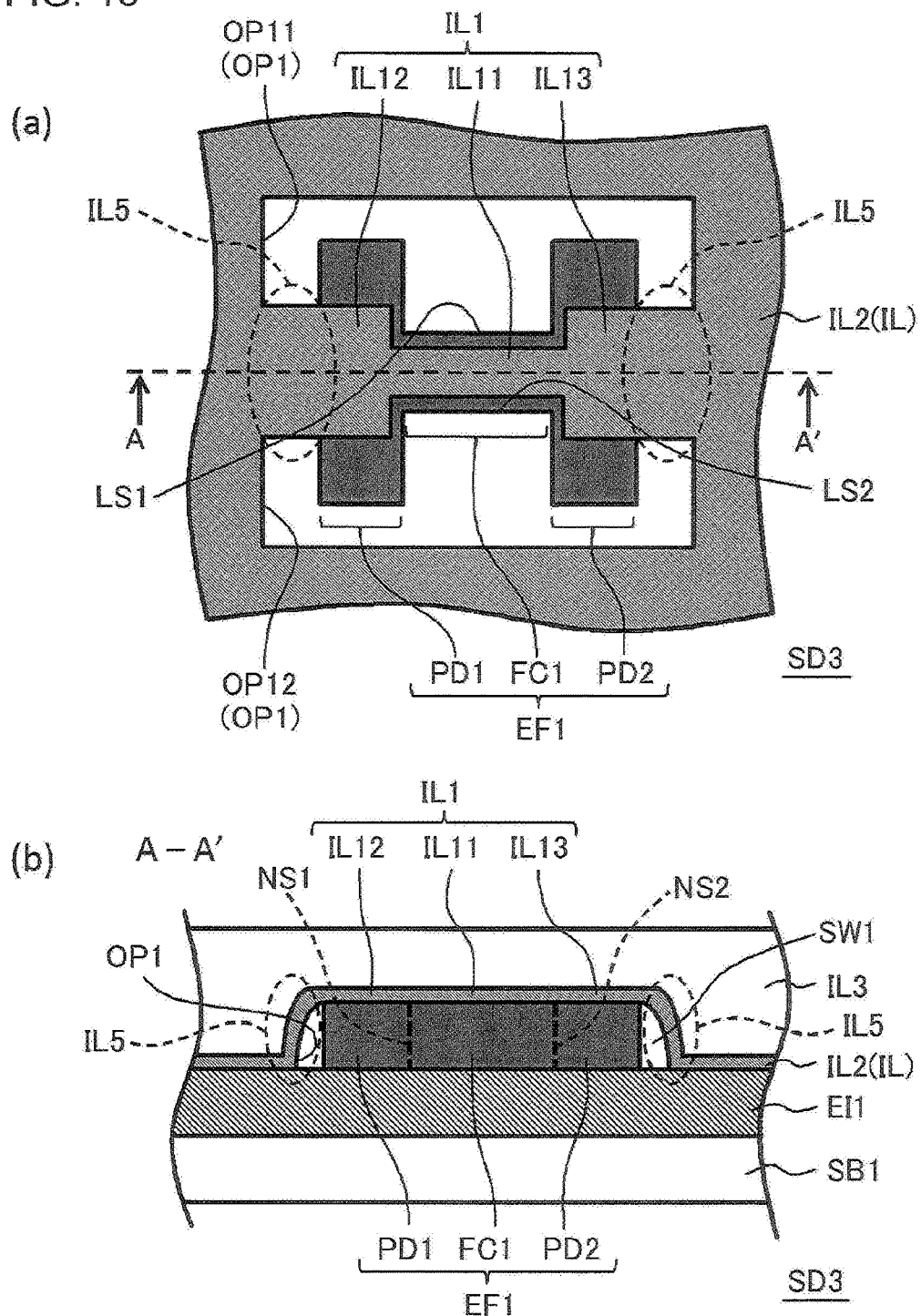
FIG. 18 is a diagram illustrating a semiconductor device according to a third embodiment.

FIG. 18 is a diagram illustrating a semiconductor device SD3 according to a third embodiment. FIG. 18(a) and FIG.

18(*b*) illustrate a plan view and a section taken along the line A-A' in FIG. 18(*a*), respectively.

In the semiconductor device SD3 according to the present embodiment, an insulating film IL5 is formed to join the insulating film IL1 formed on the first pad portion PD1 or on the second pad portion PD2 and the insulating film IL2. Except for this point, the semiconductor device SD3 according to the present embodiment may have the similar configuration as the semiconductor device SD2 according to the second embodiment.

In the following, description will be made on the semiconductor device SD3 in detail.

The semiconductor device SD3 according to the present embodiment includes a insulating film IL5 which joins the portion IL12 of the insulating film IL1 provided on the first pad portion PD1 and the portion IL13 of the insulating film IL1 provided on the second pad portion PD2 and the insulating film IL2. In FIG. 18, the insulating film IL5 is formed to be located in the first direction when viewed from the portion IL12 of the insulating film IL1 located on the first pad portion PD1 and to join the portion and IL12 and the insulating film IL2. Connecting a portion of the insulating film IL1 with the insulating film IL2 enables to more effectively generate the pressing force acting from the insulating film IL1 toward the fuse-blowing portion FC1. This enables to effectively promote growth of the void, which is to be generated in the fuse-blowing portion FC1, in the lateral direction to implement a stable blowing operation. Even in a case of having such a structure, the insulating film IL1 and the insulating film IL2 are arranged at an interval from each other regarding a region where the insulating film IL5 is not provided. Furthermore, the opening OP1 may also be formed on a portion of the first pad portion PD1 and the second pad portion PD2. This enables to relax or remove the pressure which is received by the insulating film IL1 from the insulating film IL2 and which fixes the position of the insulating film IL1 in the up and down direction.

The insulating film IL5 is integrally formed with, for instance, the insulating film IL1 and the insulating film IL2. In this case, the insulating film IL5 is made of the same insulating material as the insulating film IL1.

FIG. 18 exemplifies a case where the insulating film IL5 is formed on each of the portion IL12 of the insulating film IL1 located on the first pad portion PD1 and the portion IL13 of the insulating film IL1 located on the second pad portion PD2. Here, regarding these portions, the insulating film IL5 is formed on a side opposite to a side where the fuse-blowing portion FC1 is located. The insulating film IL5 may be formed on any one of the portion IL12 of the insulating film IL1 located on the first pad portion PD1 and the portion IL13 of the insulating film IL1 located on the second pad portion PD2.

In the structure shown in FIG. 18, a length of the insulating film IL5 in the second direction is equal to a length of a portion of the portion IL12 contacting the insulating film IL5 in the second direction. On the other hand, the length of the insulating film IL5 in the second direction may be greater than or less than the length of the portion of the portion IL12 contacting the insulating film IL5 in the second direction. In the example according to FIG. 18, the length of the insulating film IL5 in the second direction is, for instance, greater than or equal to 5 μm and less than or equal to 40 μm.

In FIG. 18, the opening OP1 is divided by, for instance, the insulating film IL1 and the insulating film IL5 provided on sides of both ends of the insulating film IL1. In this case, the opening OP1 is divided into an opening OP11 located on one side in the second direction when viewed from the electric fuse EF1 and an opening OP12 located on the other side in the second direction when viewed from the electric fuse EF1. The opening OP11 and the opening OP12 overlap a portion of each of the first pad portion PD1 and the second pad portion PD2. In the example illustrated in FIG. 18, the first long side LS1 and the second long side LS2 are arranged inside of the opening OP11 and inside of the opening OP12, respectively.

Figure 19:
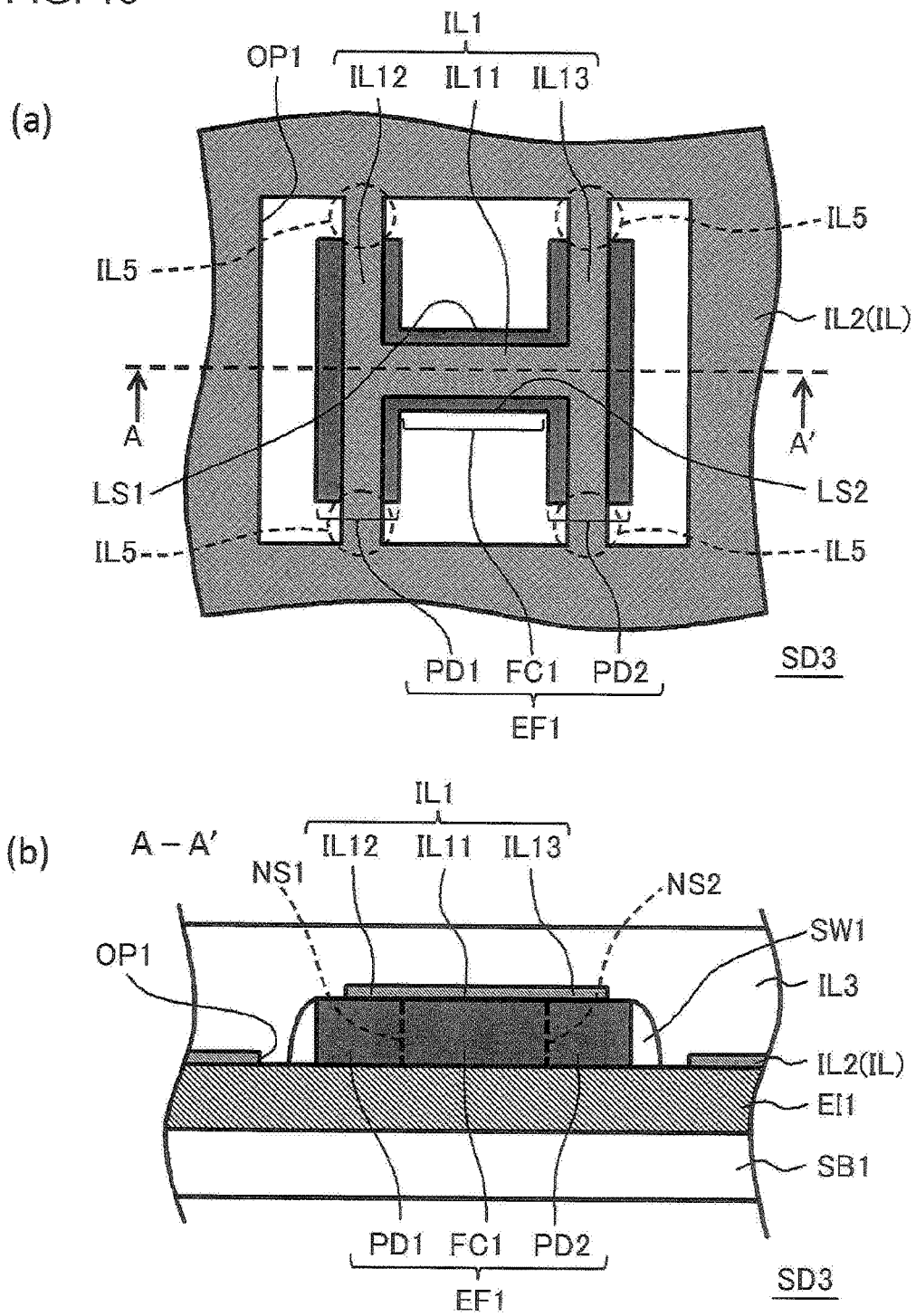
FIG. 19 is a diagram illustrating a modification example of the semiconductor device shown in FIG. 18.

FIG. 19 is a diagram illustrating a modification example of the semiconductor device SD3 shown in FIG. 18. FIG. 19(*a*) and FIG. 19(*b*) illustrate a plan view and a section taken along the line A-A' in FIG. 19(*a*), respectively.

In the present modification example, the insulating film IL5 is located in the second direction when viewed from the portion IL12 of the insulating film IL1 located on the first pad portion PD1 and is formed to connect the portion IL12 and the insulating film IL2. FIG. 19 exemplifies a case where the insulating film IL5 is formed on each of the portion IL12 of the insulating film IL1 located on the first pad portion PD1 and the portion IL13 of the insulating film IL1 located on the second pad portion PD2. In this case, the insulating film IL5 may be formed on one side or both sides in the second direction when viewed from the portion IL12 of the insulating film IL1 located on the first pad portion PD1. The insulating film IL5 may be formed on the one side or both sides in the second direction when viewed from the portion IL13 of the insulating film IL1 located on the second pad portion PD2. Even in a case of having such a structure, the insulating film IL1 and the insulating film IL2 are arranged at an interval from each other regarding a region where the insulating film IL5 is not provided. Furthermore, the opening OP1 may also be formed on a portion of the first pad portion PD1 and the second pad portion PD2. This enables to relax or remove the pressure which is received by the insulating film IL1 from the insulating film IL2 and which fixes the position of the insulating film IL1 in the up and down direction.

In FIG. 19, the insulating film IL5 is formed, for instance, on both sides in the second direction when viewed from the portion IL12 of the insulating film IL1 located on the first pad portion PD1 and the insulating film IL5 is formed on both sides in the second direction when viewed from the portion IL13 of the insulating film IL1 located on the second pad portion PD2. In this case, the opening OP1 is divided into four openings by the insulating film IL1 and the insulating film IL5. Regarding at least one of the portion IL12 of the insulating film IL1 located on the first pad portion PD1 and a portion of the portion IL13 of the insulating film IL1 located on the second pad portion PD2, the insulating film IL5 may not be formed on at least one side in the second direction.

In the structure shown in FIG. 19, the length of the insulating film IL5 in the first direction is equal to the length of a portion of the portion IL12 contacting the insulating film IL5 in the first direction. On the other hand, the length of the insulating film IL5 in the first direction may be longer than or shorter than the length of the portion of the portion IL12 contacting the insulating film IL5 in the first direction. In the example according to FIG. 19, the length of the insulating film IL5 in the first direction is, for instance, greater than or equal to 1 μm and less than or equal to 8 μm.

Also, in the present embodiment, the similar effect as the first embodiment may be obtained.

Fourth Embodiment

FIG. 20 is a diagram illustrating a semiconductor device SD4 according to a fourth embodiment. FIG. 20(*a*) and FIG.

20(b) illustrate a plan view and a section taken along the line A-A' in FIG. 20(a), respectively.

In the semiconductor device SD4 according to the present embodiment, the insulating film IL2 is formed to cover a portion of the first pad portion PD1. A portion of the insulating film IL2 provided on the first pad portion PD1 is connected with the insulating film IL1. Except for these points, the semiconductor device SD4 according to the present embodiment may have the similar configuration as the semiconductor device SD1 according to the first embodiment.

In the following, description will be made on the semiconductor device SD4 in detail.

In the semiconductor device SD4 according to the present embodiment, the insulating film IL2 is formed to cover a portion of the first pad portion PD1. A portion of the insulating film IL2 provided on the first pad portion PD1 is connected with the insulating film IL1. On the other hand, a portion of the first pad portion PD1 is not covered by the insulating film IL1 and the insulating film IL2. That is, the opening OP1 may be formed on the first pad portion PD1 close to the fuse-blowing portion FC1. Also in the present embodiment, this enables to relax or remove the pressure which is received by the insulating film IL1 from the insulating film IL2 and which fixes the position of the insulating film IL1 in the up and down direction.

FIG. 20 exemplifies a case where the insulating film IL2 is formed to cover a portion of the first pad portion PD1 and a portion of the second pad portion PD2. A portion of the insulating film IL2 provided on the first pad portion PD1 and a portion of the insulating film IL2 provided on the second pad portion PD2 are connected with the insulating film IL1 provided on the fuse-blowing portion FC1. On the other hand, a portion of the first pad portion PD1 and a portion of the second pad portion PD2 are not covered by the insulating film IL1 and the insulating film IL2. In such a case, the opening OP1 is divided into the opening OP11 and the opening OP12 by the insulating film IL1 and the insulating film IL2.

Also, in the present embodiment, the similar effect as the first embodiment may be obtained.

According to the embodiments, the following inventions are disclosed.

(Attachment 1)

A semiconductor device comprising:

a semiconductor substrate;

an electric fuse formed over the semiconductor substrate and blown by allowing a predetermined current to flow;

a first insulating film formed over the electric fuse;

a second insulating film formed over the semiconductor substrate and made of the same insulating material as the first insulating film; and a third insulating film formed to cover the electric fuse, the first insulating film, and the second insulating film, wherein the electric fuse includes a polysilicon film, the electric fuse includes a fuse-blowing portion, a first pad portion, and the second pad portion, the fuse-blowing portion is formed between the first pad portion and the second pad portion in the first direction and is a rectangular shape having a first short side and a second short side along a second direction perpendicular to the first direction, the first pad portion has a width greater than the first short side in the second direction and is integrally formed with the fuse-blowing portion at a side of the first short side, the second pad portion has a width greater than the second short side in the second direction and is integrally formed with the fuse-blowing portion at a side of the second short side, the first insulating film is formed continuously between the first short side and the second short side to cover a surface of the fuse-blowing portion, the second insulating film is formed to planarly surround the first insulating film and arranged at an interval from the first insulating film in the first direction and the second direction, and a stress of the first insulating film and a stress of the second insulating film are greater than a stress of the third insulating film.

(Attachment 2)

The semiconductor device according to Attachment 1, wherein the third insulating film is an oxygen-containing silicon film.

(Attachment 3)

The semiconductor device according to Attachment 1, wherein an element isolation part formed with a silicon oxide film is formed over the semiconductor substrate and the electric fuse is formed over the element isolation part.

(Attachment 4)

A semiconductor device comprising:

a semiconductor substrate;

a fuse-blowing portion provided over the semiconductor substrate and extending in a first direction;

a first pad portion provided at one end of the fuse-blowing portion and of which a width in a second direction perpendicular to the first direction is greater than the fuse-blowing portion;

a second pad portion provided at another end opposite to the one end of the fuse-blowing portion and of which a width in the second direction is greater than the fuse-blowing portion;

a first nitrogen-containing silicon film including an opening inside of which the fuse-blowing portion is located;

a second nitrogen-containing silicon film provided over the fuse-blowing portion to cover the fuse-blowing portion throughout the first direction and located inward from the opening in the first direction and the second direction, and an insulating film covering the first nitrogen-containing silicon film and the second nitrogen-containing silicon film.

(Attachment 5)

The semiconductor device according to Attachment 4, wherein the second nitrogen-containing silicon film is provided over the fuse-blowing portion, the first pad portion, and the second pad portion.

(Attachment 6)

The semiconductor device according to Attachment 4, wherein the insulating film is an oxygen-containing silicon film.

(Attachment 7)

The semiconductor device according to Attachment 5, wherein the second nitrogen-containing silicon film covers a portion of the first pad portion and does not cover the other portion.

(Attachment 8)

The semiconductor device according to Attachment 4, wherein the first nitrogen-containing silicon film does not cover the first pad portion.

(Attachment 9)

The semiconductor device according to Attachment 4, wherein the second nitrogen-containing silicon film does not cover the first pad portion.

(Attachment 10)
The semiconductor device according to Attachment 4,
wherein the second nitrogen-containing silicon film is located inward from the opening in the entire periphery.

(Attachment 11)
The semiconductor device according to Attachment 4,
wherein the fuse-blowing portion is blown by allowing a predetermined current to flow between the first pad portion and the second pad portion.

(Attachment 12)
The semiconductor device according to Attachment 4,
wherein the fuse-blowing portion includes a polysilicon film and a silicide film provided over the polysilicon film.

(Attachment 13)
A semiconductor device comprising:
a semiconductor substrate;
a fuse-blowing portion provided over the semiconductor substrate and extending in a first direction;
a first pad portion provided at one end of the fuse-blowing portion and of which a width in a second direction perpendicular to the first direction is greater than the fuse-blowing portion;
a second pad portion provided at another end opposite to the one end of the fuse-blowing portion and of which a width in the second direction is greater than the fuse-blowing portion;
a nitrogen-containing silicon film provided over the fuse-blowing portion and around the fuse-blowing portion to cover the fuse-blowing portion throughout the first direction and including openings at both sides of the fuse-blowing portion in the second direction; and
an insulating film covering the nitrogen-containing silicon film,
wherein at least a portion of the first pad portion is not covered by the nitrogen-containing silicon film.

(Attachment 14)
The semiconductor device according to Attachment 13,
wherein the insulating film is an oxygen-containing silicon film.

(Attachment 15)
The semiconductor device according to Attachment 13,
wherein the nitrogen-containing silicon film does not cover the first pad.

(Attachment 16)
The semiconductor device according to Attachment 13,
wherein the fuse-blowing portion is blown by allowing a predetermined current to flow between the first pad portion and the second pad portion.

(Attachment 17)
The semiconductor device according to Attachment 13,
wherein the fuse-blowing portion includes a polysilicon film and a silicide film provided over the polysilicon film.

(Attachment 18)
A method of manufacturing a semiconductor device, comprising:
forming an electric fuse over a semiconductor substrate, the electric fuse being configured by a fuse-blowing portion extending in a first direction, a first pad portion connected to one end of the fuse-blowing portion and of which a width in a second direction perpendicular to the first direction is greater than the fuse-blowing portion, and a second pad portion connected to another end opposite to the one end of the fuse-blowing portion and of which a width in the second direction is greater than the fuse-blowing portion;
forming a nitrogen-containing silicon film over the semiconductor substrate to cover the electric fuse;
patterning the nitrogen-containing silicon film; and
forming an insulating film over the nitrogen-containing silicon film;
wherein the process of patterning the nitrogen-containing silicon film is performed to form a first portion including an opening inside of which the fuse-blowing portion is located and a second portion located over the fuse-blowing portion to cover the fuse-blowing portion throughout the first direction and located inward from the opening in the first direction and the second direction.

(Attachment 19)
A method of manufacturing a semiconductor device, comprising:
forming an electric fuse over a semiconductor substrate, the electric fuse being configured by a fuse-blowing portion extending in a first direction, a first pad portion connected to one end of the fuse-blowing portion and of which a width in a second direction perpendicular to the first direction is greater than the fuse-blowing portion, and a second pad portion connected to another end opposite to the one end of the fuse-blowing portion and of which a width in the second direction is greater than the fuse-blowing portion;
forming a nitrogen-containing silicon film over the semiconductor substrate to cover the electric fuse;
patterning the nitrogen-containing silicon film; and
forming an insulating film over the nitrogen-containing silicon film,
wherein the process of patterning the nitrogen-containing silicon film is performed in such away that the nitrogen-containing silicon film after the patterning is located over the fuse-blowing portion to cover the fuse-blowing portion throughout the first direction and includes openings at both sides of the fuse-blowing portion in the second direction and over at least a portion of the first pad portion.

In this manner, although the invention made by the present inventors are described in detail based over the embodiments, the present invention is not limited thereto and it is needless to say that various modifications may be made thereto without departing from the gist of the invention.

The invention claimed is:
1. A semiconductor device comprising:
a semiconductor substrate;
an electric fuse formed over the semiconductor substrate and blown by allowing a predetermined current to flow;
a first insulating film formed over the electric fuse;
a second insulating film formed over the semiconductor substrate and made of the same insulating material as the first insulating film; and
a third insulating film formed to cover the electric fuse, the first insulating film, and the second insulating film,
wherein the electric fuse comprises a polysilicon film,
the electric fuse comprises a fuse-blowing portion, a first pad portion, and a second pad portion,
the fuse-blowing portion is formed between the first pad portion and the second pad portion in a first direction and is a rectangular shape having a first short side and a second short side along a second direction perpendicular to the first direction,
the first pad portion comprises a width greater than the first short side in the second direction and is integrally formed with the fuse-blowing portion at a side of the first short side,
the second pad portion comprises a width greater than the second short side in the second direction and is integrally formed with the fuse-blowing portion at a side of the second short side, the first insulating film is formed continuously between the first short side and the second short side to cover a surface of the fuse-blowing portion, the second insulating film is formed to surround the electric fuse in plan view and is apart from the first insulating film in the first direction and the second direction, and a stress of the first insulating film and a stress of the second insulating film are greater than a stress of the third insulating film.

2. The semiconductor device according to claim 1, wherein a length of the first insulating film in a first direction is longer than a length of the fuse-blowing portion in the first direction.

3. The semiconductor device according to claim 1, wherein a length of the first insulating film in the second direction is shorter than a length of the fuse-blowing portion in the second direction.

4. The semiconductor device according to claim 1, wherein the first insulating film is an insulating film having a tensile stress.

5. The semiconductor device according to claim 1, wherein the first insulating film is formed also over the first pad portion and over the second pad portion.

6. The semiconductor device according to claim 5, wherein a fourth insulating film is formed integrally with the first insulating film and the second insulating film of the same insulating material as the first insulating film to join the first insulating film formed over the first pad or the second pad and the second insulating film.

7. The semiconductor device according to claim 1, wherein a plurality of contacts for supplying a potential to the electric fuse are formed in the third insulating film, a first contact of the plurality of contacts is connected to the first pad portion, and a second contact of the plurality of contacts is connected to the second pad portion.

8. The semiconductor device according to claim 7, wherein a lower portion of the plurality of contacts is surrounded by the first insulating film or the second insulating film.

9. The semiconductor device according to claim 1, wherein a side wall is formed over a side wall of the fuse-blowing portion, and the first insulating film is formed not to planarly overlap with the side wall.

10. The semiconductor device according to claim 1, wherein the electric fuse comprises a silicide film formed over the polysilicon film.

11. The semiconductor device according to claim 1, wherein the first insulating film and the second insulating film are a nitrogen-containing silicon film.

12. A semiconductor device comprising:
a semiconductor substrate;
a fuse-blowing portion provided over the semiconductor substrate and extending in a first direction;
a first pad portion provided at one end of the fuse-blowing portion and of which a width in a second direction perpendicular to the first direction is greater than the fuse-blowing portion;
a second pad portion provided at another end opposite to the one end of the fuse-blowing portion and of which a width in the second direction is greater than the fuse-blowing portion;
a first nitrogen-containing silicon film comprising an opening in plan view in which all of the fuse-blowing portion, the first pad portion and the second pad portion is located;
a second nitrogen-containing silicon film provided over the fuse-blowing portion to cover the fuse-blowing portion throughout the first direction and located inward from the opening in the first direction and the second direction, the second nitrogen-containing silicon film being apart from the first nitrogen-containing silicon film in the first direction and the second direction; and
an insulating film covering the first nitrogen-containing silicon film and the second nitrogen-containing silicon film.

13. The semiconductor device according to claim 12, wherein the second nitrogen-containing silicon film is provided over the fuse-blowing portion, over the first pad portion, and over the second pad portion.

14. The semiconductor device according to claim 12, wherein a length of the second nitrogen-containing silicon film in the second direction is shorter than a length of the fuse-blowing portion in the second direction.

15. The semiconductor device according to claim 12, wherein a side wall is formed over a side wall of the fuse-blowing portion, and the second nitrogen-containing silicon film is formed not to planarly overlap with the side wall.

16. The semiconductor device according to claim 13, further comprising:
a third nitrogen-containing silicon film located in the second direction when viewed from a portion of the second nitrogen-containing silicon film located over the first pad portion and connecting the portion and the first nitrogen-containing silicon film.

17. The semiconductor device according to claim 13, further comprising:
a fourth nitrogen-containing silicon film located in the first direction when viewed from a portion of the second nitrogen-containing silicon film located over the first pad portion and connecting the portion and the first nitrogen-containing silicon film.

* * * * *